(12) United States Patent
He et al.

(10) Patent No.: US 8,008,174 B2
(45) Date of Patent: Aug. 30, 2011

(54) CONTINUOUS FEED CHEMICAL VAPOR DEPOSITION

(75) Inventors: Gang He, Cupertino, CA (US); Gregg Higashi, San Jose, CA (US)

(73) Assignee: Alta Devices, Inc., Santa Clara, CA (US)

( * ) Notice: Subject to any disclaimer, the term of this patent is extended or adjusted under 35 U.S.C. 154(b) by 33 days.

(21) Appl. No.: 12/577,641

(22) Filed: Oct. 12, 2009

(65) Prior Publication Data

US 2010/0120233 A1 May 13, 2010

Related U.S. Application Data

(60) Provisional application No. 61/104,288, filed on Oct. 10, 2008.

(51) Int. Cl.
*H01L 21/20* (2006.01)
*H01L 21/36* (2006.01)
*C23C 16/00* (2006.01)

(52) U.S. Cl. .................. 438/507; 257/E21.09; 118/718

(58) Field of Classification Search .................. 118/715, 118/718, 729; 438/570; 257/E21.09
See application file for complete search history.

(56) References Cited

U.S. PATENT DOCUMENTS

| | | |
|---|---|---|
| 3,993,533 A | 11/1976 | Milnes et al. |
| 4,445,965 A | 5/1984 | Milnes |
| 4,727,047 A | 2/1988 | Bozler et al. |
| 4,846,931 A | 7/1989 | Gmitter et al. |
| 4,883,561 A | 11/1989 | Gmitter et al. |
| 5,073,230 A | 12/1991 | Maracas et al. |
| 5,122,852 A | 6/1992 | Chang et al. |
| 5,201,996 A | 4/1993 | Gmitter et al. |
| 5,221,637 A | 6/1993 | De Boeck |
| 5,256,562 A | 10/1993 | Vu et al. |
| 5,258,325 A | 11/1993 | Spitzer et al. |
| 5,276,345 A | 1/1994 | Siegel et al. |
| 5,277,749 A | 1/1994 | Griffith et al. |
| 5,286,335 A | 2/1994 | Drabik et al. |

(Continued)

FOREIGN PATENT DOCUMENTS

WO   WO-2006131316 A1   12/2006

OTHER PUBLICATIONS

Bauhuis, G.J., "Substrate Reuse for Epitaxial Lift-Off of III-V Solar Cells", Proceedings of the 22nd European Photovoltaic Solar Energy Conference: Milan, Sep. 3-7, 2007, pp. 106-110.

(Continued)

*Primary Examiner* — Walter L Lindsay, Jr.
(74) *Attorney, Agent, or Firm* — Sawyer Law Group, P.C.

(57) ABSTRACT

Embodiments of the invention generally relate to a method for forming a multi-layered material during a continuous chemical vapor deposition (CVD) process. In one embodiment, a method for forming a multi-layered material during a continuous CVD process is provided which includes continuously advancing a plurality of wafers through a deposition system having at least four deposition zones. Multiple layers of materials are deposited on each wafer, such that one layer is deposited at each deposition zone. The methods provide advancing each wafer through each deposition zone while depositing a first layer from the first deposition zone, a second layer from the second deposition zone, a third layer from the third deposition zone, and a fourth layer from the fourth deposition zone. Embodiments described herein may be utilized to form an assortment of materials on wafers or substrates, especially for forming Group III/V materials on GaAs wafers.

32 Claims, 24 Drawing Sheets

U.S. PATENT DOCUMENTS

| | | | |
|---|---|---|---|
| 5,344,517 | A | 9/1994 | Houlding |
| 5,401,983 | A | 3/1995 | Jokerst et al. |
| 5,411,592 | A * | 5/1995 | Ovshinsky et al. ........... 118/718 |
| 5,458,694 | A | 10/1995 | Nuyen |
| 5,465,009 | A | 11/1995 | Drabik et al. |
| 5,476,810 | A | 12/1995 | Curran |
| 5,479,043 | A | 12/1995 | Nuyen |
| 5,528,719 | A | 6/1996 | Yamada |
| 5,546,375 | A | 8/1996 | Shimada et al. |
| 5,641,381 | A | 6/1997 | Bailey et al. |
| 5,827,751 | A | 10/1998 | Nuyen |
| 5,985,742 | A | 11/1999 | Henley et al. |
| 6,010,579 | A | 1/2000 | Henley et al. |
| 6,071,795 | A | 6/2000 | Cheung et al. |
| 6,155,909 | A | 12/2000 | Henley et al. |
| 6,214,733 | B1 | 4/2001 | Sickmiller |
| 6,221,740 | B1 | 4/2001 | Bryan et al. |
| 6,232,136 | B1 | 5/2001 | Zavracky et al. |
| 6,263,941 | B1 | 7/2001 | Bryan et al. |
| 6,284,631 | B1 | 9/2001 | Henley et al. |
| 6,287,891 | B1 | 9/2001 | Sayyah |
| 6,290,804 | B1 | 9/2001 | Henley et al. |
| 6,291,313 | B1 | 9/2001 | Henley et al. |
| 6,294,814 | B1 | 9/2001 | Henley et al. |
| 6,346,459 | B1 | 2/2002 | Usenko et al. |
| 6,352,909 | B1 | 3/2002 | Usenko |
| 6,387,829 | B1 | 5/2002 | Usenko et al. |
| 6,391,740 | B1 | 5/2002 | Cheung et al. |
| 6,414,783 | B2 | 7/2002 | Zavracky et al. |
| 6,458,672 | B1 | 10/2002 | Henley et al. |
| 6,486,041 | B2 | 11/2002 | Henley et al. |
| 6,500,732 | B1 | 12/2002 | Henley et al. |
| 6,504,524 | B1 | 1/2003 | Gates et al. |
| 6,511,899 | B1 | 1/2003 | Henley et al. |
| 6,513,564 | B2 | 2/2003 | Bryan et al. |
| 6,528,391 | B1 | 3/2003 | Henley et al. |
| 6,548,382 | B1 | 4/2003 | Henley et al. |
| 6,554,046 | B1 | 4/2003 | Bryan et al. |
| 6,559,075 | B1 | 5/2003 | Kelly et al. |
| 6,589,811 | B2 | 7/2003 | Sayyah |
| 6,632,724 | B2 | 10/2003 | Henley et al. |
| 6,669,801 | B2 | 12/2003 | Yoshimura et al. |
| 6,677,249 | B2 | 1/2004 | Laermer et al. |
| 6,740,604 | B2 | 5/2004 | Kelly et al. |
| 6,790,747 | B2 | 9/2004 | Henley et al. |
| 6,809,044 | B1 | 10/2004 | Aspar et al. |
| 6,890,838 | B2 | 5/2005 | Henley et al. |
| 6,943,050 | B2 | 9/2005 | Kondo |
| 6,974,521 | B2 | 12/2005 | Schermer |
| 7,045,878 | B2 | 5/2006 | Faris |
| 7,056,808 | B2 | 6/2006 | Henley et al. |
| 7,060,591 | B2 | 6/2006 | Yamazaki et al. |
| 7,153,761 | B1 | 12/2006 | Nastasi et al. |
| 7,160,790 | B2 | 1/2007 | Henley et al. |
| 7,163,826 | B2 | 1/2007 | Faris |
| 7,198,671 | B2 | 4/2007 | Ueda |
| 7,202,141 | B2 | 4/2007 | Park et al. |
| 7,229,901 | B2 | 6/2007 | Savage et al. |
| 7,241,667 | B2 | 7/2007 | Park et al. |
| 7,341,925 | B2 | 3/2008 | Kelly et al. |
| 7,348,258 | B2 | 3/2008 | Henley et al. |
| 7,638,410 | B2 | 12/2009 | Nastasi et al. |
| 2006/0024442 | A1 | 2/2006 | Ovshinsky |
| 2006/0073276 | A1 | 4/2006 | Antonissen |
| 2007/0068559 | A1 | 3/2007 | Brody |
| 2009/0321881 | A1 | 12/2009 | Archer et al. |
| 2009/0321885 | A1 | 12/2009 | Archer et al. |
| 2009/0321886 | A1 | 12/2009 | Gmitter et al. |
| 2009/0324379 | A1 | 12/2009 | He et al. |
| 2009/0325367 | A1 | 12/2009 | He et al. |
| 2010/0001316 | A1 | 1/2010 | Gmitter et al. |
| 2010/0001374 | A1 | 1/2010 | Gmitter et al. |

OTHER PUBLICATIONS

Bauhuis, G.J., "Thin film GaAs solar cells with increased quantum efficiency due to light reflection", Solar Energy Materials & Solar Cells 83 (2004) 81-90, Nov. 3, 2003.

Konagai, Makoto, "High Efficiency GaAs Thin Film Solar Cells by Peeled Film Technology", Journal of Crystal Growth 45 (1978) 277-280.

Kumar, P., "Sacrificial etching of $Al_xGa_{1-x}As$ for III-V MEMS surface micromachining", Appl. Phys. A 88, 711-714, May 24, 2007.

Schermer J.J., "Epitaxial Lift-Off for large area thin film III/V devices", Phys. Stat. Sol. (1) 202, No. 4, 501-508 (2005).

Schermer, J.J., "Photon confinement in high-efficiency, thin-film III-V solar cells obtained by epitaxial lift-off", Thin Solid Films 511-512 (2006) 645-653, Jan. 19, 2006.

Schermer, J.J., "Thin-film GaAs Epitaxial Lift-Off Solar Cells for Space Applications", Prog. Photovolt: Res. Appl. 2005; 13:587-596, Apr. 28, 2005.

Schermer, John, "Solar Cells Based on III-V Semiconductors", Joint Solar Panel, Sep. 29, 2004.

Sickmiller, Mike, "Packaging of Ultrathin Semiconductor Devices Through the ELO Packaging Process", Mat. Res. Soc. Symp. Proc. vol. 681E (2001).

van Deelen, J. "On the development of high-efficiency thin-film GaAs and GaInP2 cells", Journal of Crystal Growth 298 (2007) 772-776, Nov. 28, 2006.

van Niftrik, A. T. J., "HF Species and Dissolved Oxygen on the Epitaxial Lift-Off Process of GaAs Using AlAsP Release Layers", Journal of the Electrochemical Society, 155 (1) D35-D39 (2008), Nov. 6, 2007.

van Niftrik, A.T.J., "A Diffusion and Reaction Related Model of the Epitaxial Lift-Off Process", Journal of the Electrochemical Society, 154 (11) D629-D635 (2007), Sep. 19, 2007.

van Niftrik, Antonius T. J., "The Influence of $In_xGa_{1-x}As$ and $GaAs_{1-y}P_y$ Layers Surrounding the AlAs Release Layer in the Epitaxial Lift-Off Process", Crystal Growth & Design, 2007, vol. 7, No. 12, 2472-2480, Aug. 7, 2007.

Voncken, M.M.A.J., "Strain-accelerated HF etching of AlAs for epitaxial lift-off", J. Phys.: Condens. Matter 16 (2004) 3585-3596, May 14, 2004.

Voncken, M.M.A.J., "Influence of radius of curvature on the lateral etch rate of the weight induced epitaxial lift-off process", Material Science and Engineering B95 (2002) 242-248, May 21, 2002.

Voncken, M.M.A.J., "Multiple release layer study of the intrinsic lateral etch rate of the epitaxial lift-off process", Appl. Phys. A 79, 1801-1807, Mar. 28, 2003.

Yablonovitch, E., "Van De Waals bonding of GaAs epitaxial liftoff films onto arbitrary substrates", Appl. Phys. Lett. 56 (24), Jun. 11, 1990.

PCT International Search Report and Written Opinion dated May 18, 2010 for International Application No. PCT/US2009/060372.

* cited by examiner

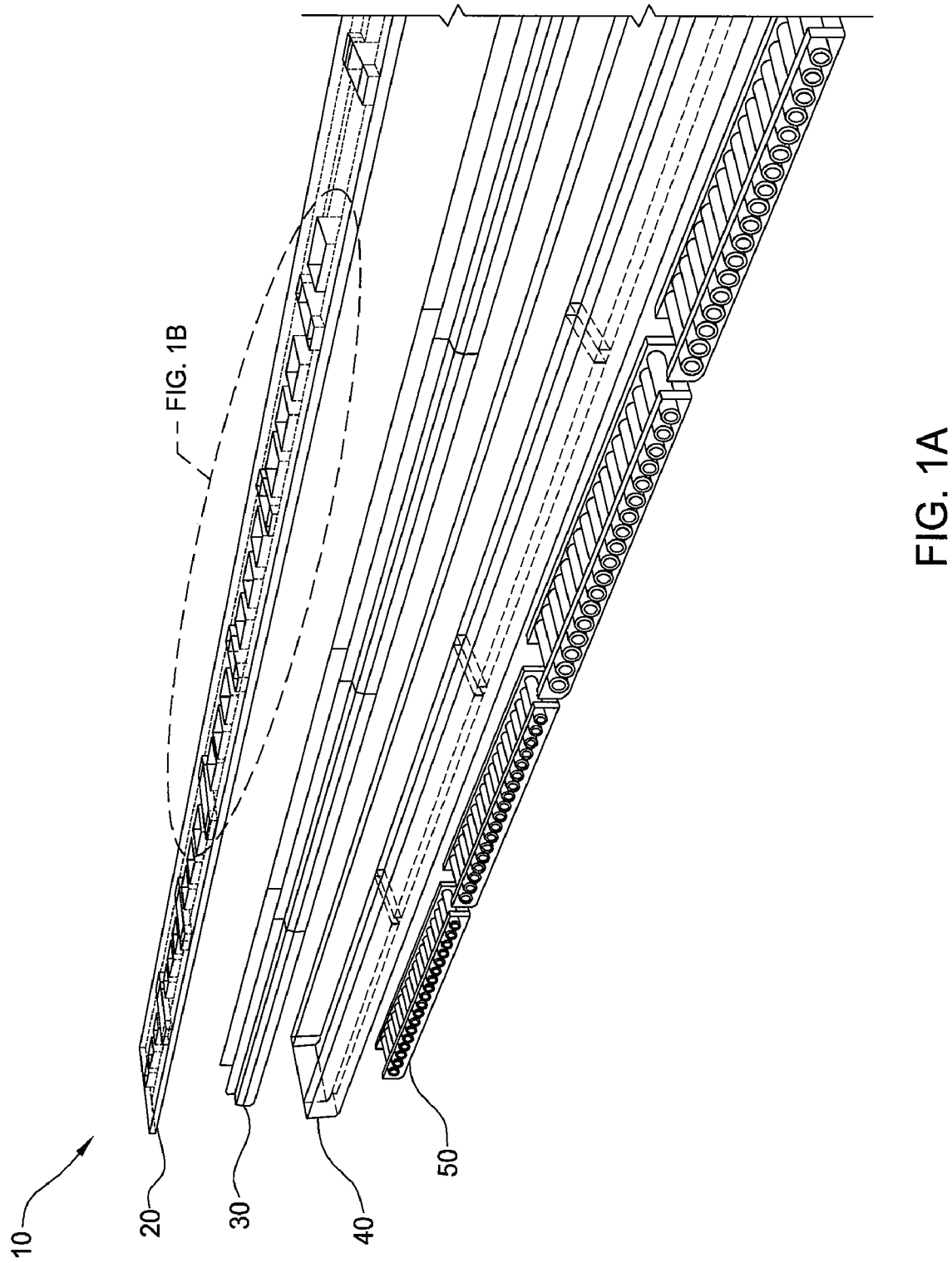

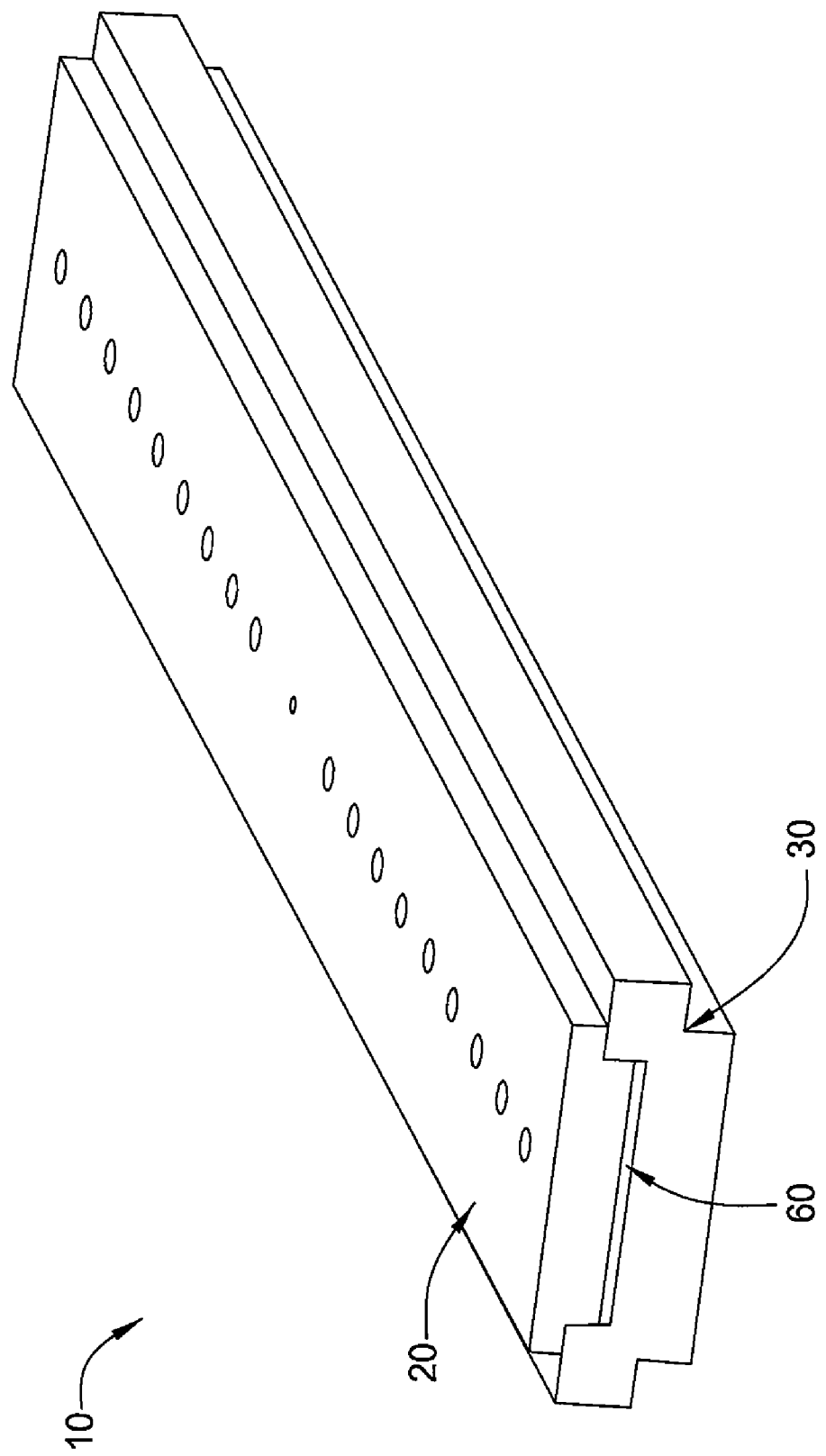

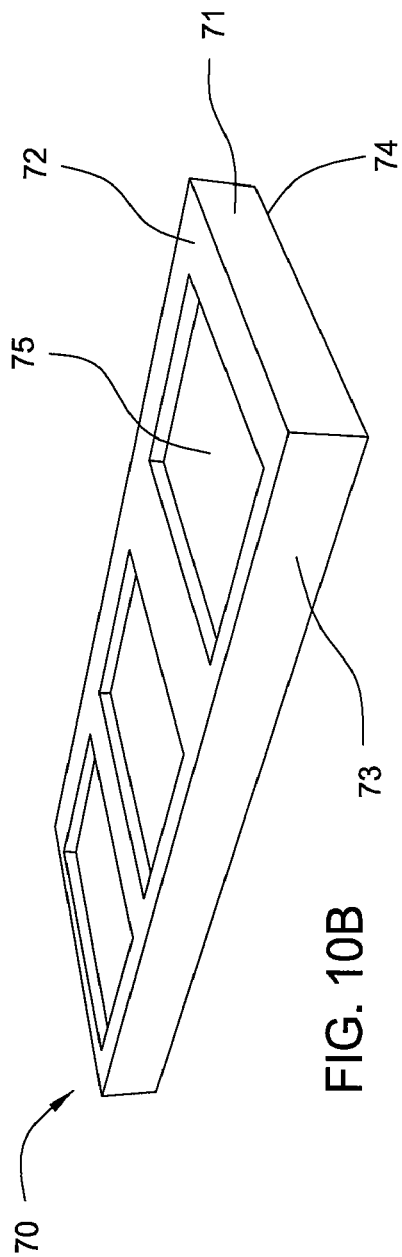
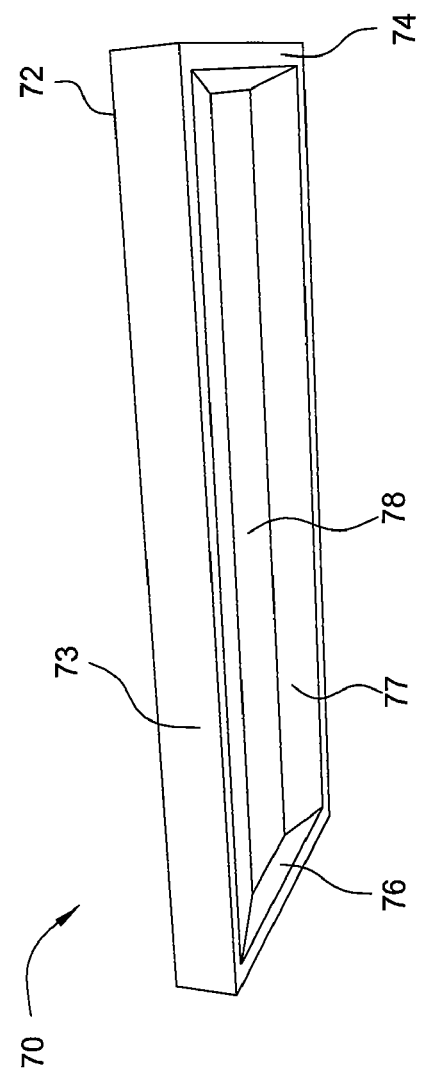
FIG. 10B
FIG. 10C

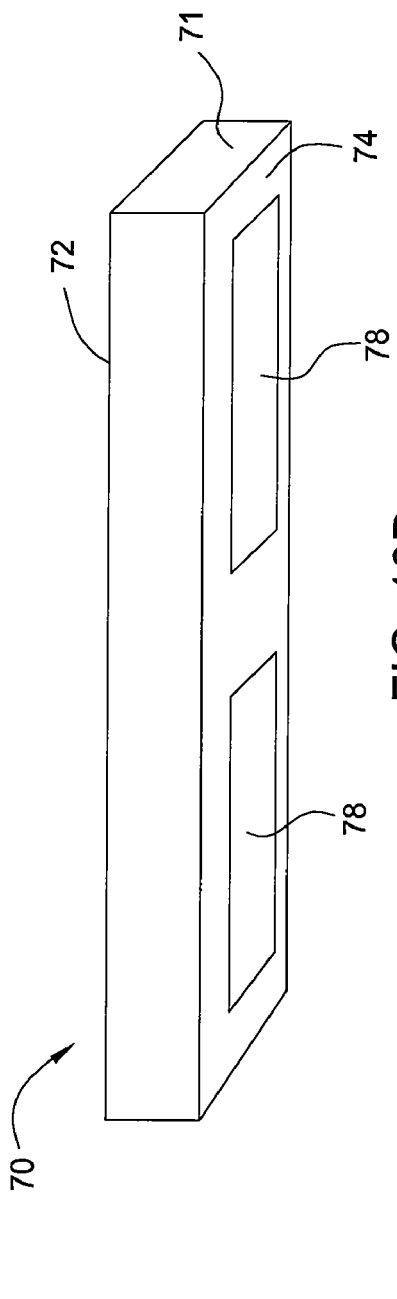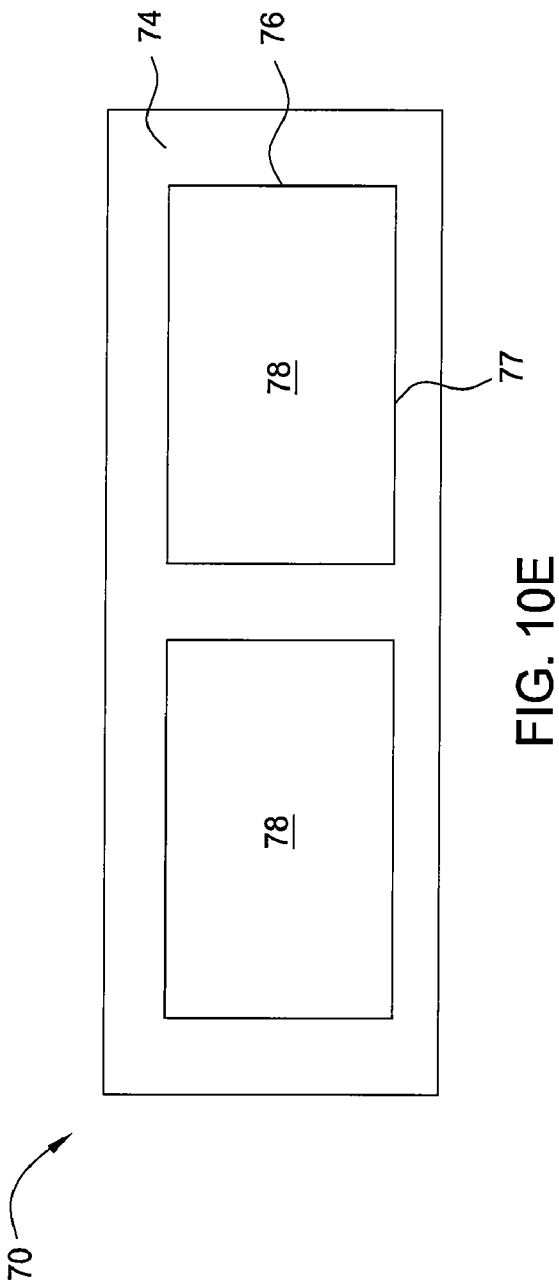

CONTINUOUS FEED CHEMICAL VAPOR DEPOSITION

CROSS-REFERENCE TO RELATED APPLICATIONS

This application claims benefit of U.S. Ser. No. 61/104,288, filed Oct. 10, 2008, which is hereby incorporated by reference in its entirety.

BACKGROUND OF THE INVENTION

1. Field of the Invention

Embodiments of the invention generally relate to methods and apparatuses for vapor deposition, and more particularly, to chemical vapor deposition processes and chambers.

2. Description of the Related Art

Chemical vapor deposition ("CVD") is the deposition of a thin film on a substrate, such as a wafer, by the reaction of vapor phase chemicals. Chemical vapor deposition reactors are used to deposit thin films of various compositions on the substrate. CVD is highly utilized in many activities, such as during the fabrication of devices for semiconductor, solar, display, and other electronic applications.

There are numerous types of CVD reactors for very different applications. For example, CVD reactors include atmospheric pressure reactors, low pressure reactors, low temperature reactors, high temperature reactors, and plasma enhanced reactors. These distinct designs address a variety of challenges that are encountered during a CVD process, such as depletion effects, contamination issues, and reactor maintenance.

Notwithstanding the many different reactor designs, there is a need for new and improved CVD reactor designs.

SUMMARY OF THE INVENTION

Embodiments of the invention generally relate to a method for forming a multi-layered material during a continuous chemical vapor deposition (CVD) process. In many embodiments, the wafers horizontally advance or move in the same direction and at the same relative rate through multiple deposition zones within the deposition system. Multiple layers of materials are deposited on each wafer, such that one layer is deposited at each deposition zone. The multiple deposited layers on each wafer may all have the same composition, but usually, each layer differs by composition. Embodiments described herein may be utilized for a variety of CVD and/or epitaxial deposition processes to deposit, grow, or otherwise form an assortment of materials on wafers or substrates, especially for forming Group III/V materials on gallium arsenide wafers.

In one embodiment, a method for forming a multi-layered material during a continuous CVD process is provided which includes continuously advancing a plurality of wafers through a deposition system, wherein the deposition system has a first deposition zone, a second deposition zone, a third deposition zone, and a fourth deposition zone, and depositing a first material layer on a first wafer within the first deposition zone. The method further provides depositing a second material layer on the first wafer within the second deposition zone, while depositing the first material layer on a second wafer within the first deposition zone. The method further provides depositing a third material layer on the first wafer within the third deposition zone, while depositing the second material layer on the second wafer within the second deposition zone, and while depositing the first material layer on a third wafer within the first deposition zone. The method further provides depositing a fourth material layer on the first wafer within the fourth deposition zone, while depositing the third material layer on the second wafer within the third deposition zone, while depositing the second material layer on the third wafer within the second deposition zone, and while depositing the first material layer on a fourth wafer within the first deposition zone.

In some embodiments, the method further provides depositing a fifth material layer on the first wafer within a fifth deposition zone, while depositing the fourth material layer on the second wafer within the fourth deposition zone, while depositing the third material layer on the third wafer within the third deposition zone, while depositing the second material layer on the fourth wafer within the second deposition zone, and while depositing the first material layer on a fifth wafer within the first deposition zone.

In some examples provide that the first material layer, the second material layer, the third material layer, and the fourth material layer have the same composition. In other examples, each of the first material layer, the second material layer, the third material layer, and the fourth material layer has a different composition. In many examples, each of the first material layer, the second material layer, the third material layer, and the fourth material layer contains arsenic, such as gallium arsenic, aluminum arsenic, aluminum gallium arsenic, alloys thereof, derivatives, or other materials.

The method further provides heating each of the wafers to a predetermined temperature within a heat-up zone prior to advancing into the first deposition zone. The predetermined temperature may be within a range from about 50° C. to about 750° C., preferably, from about 100° C. to about 350° C. In some embodiments, each of the wafers may be heated to the predetermined temperature for a duration within a range from about 2 minutes to about 6 minutes or from about 3 minutes to about 5 minutes. The method also provides transferring each of the wafers into a cool-down zone subsequent to depositing the fourth material layer. Thereafter, the wafers may be cooled to a predetermined temperature while in the cool-down zone. The predetermined temperature may be within a range from about 18° C. to about 30° C. In some embodiments, each of the wafers may be cooled to the predetermined temperature for a duration within a range from about 2 minutes to about 6 minutes or from about 3 minutes to about 5 minutes.

In other embodiments, the wafers pass through a heat-up zone prior to entering the first deposition zone and the wafers pass through a cool-down zone subsequent to exiting the fourth deposition zone. The heat-up zone, the first deposition zone, the second deposition zone, the third deposition zone, and the fourth deposition zone, and the cool-down zone may all share a common linear path. The wafers may continuously and horizontally advance along the common linear path within the deposition system.

In one embodiment, a method for forming a multi-layered material during a continuous CVD process is provided which includes continuously advancing a plurality of wafers through a deposition system, wherein the deposition system has a first deposition zone, a second deposition zone, a third deposition zone, and a fourth deposition zone. The method further provides depositing a buffer layer on a first wafer within the first deposition zone, depositing a sacrificial layer on the first wafer within the second deposition zone, while depositing the buffer layer on a second wafer within the first deposition zone. The method further provides depositing a passivation layer on the first wafer within the third deposition zone, while depositing the sacrificial layer on the second wafer within the second deposition zone, and while depositing the buffer layer on a third wafer within the first deposition zone. The method further provides depositing a gallium arsenide active layer on the first wafer within the fourth deposition zone, while depositing the passivation layer on the second wafer within the third deposition zone, while depositing the sacrificial layer on the third wafer within the second deposition zone, and while depositing the buffer layer on a fourth wafer within the first deposition zone. In many examples, the wafers are gallium arsenide wafers.

In some embodiments, the method further provides depositing a gallium-containing layer on the first wafer within a fifth deposition zone, while depositing the gallium arsenide active layer on the second wafer within the fourth deposition zone, while depositing the passivation layer on the third wafer within the third deposition zone, while depositing the sacrificial layer on the fourth wafer within the second deposition zone, and while depositing the buffer layer on a fifth wafer within the first deposition zone. In some examples, the gallium-containing layer contains a phosphorous gallium arsenide.

In some embodiments, the method further provides heating each of the wafers to a predetermined temperature within a heat-up zone prior to the wafer advancing into the first deposition zone. The predetermined temperature may be within a range from about 50° C. to about 750° C., preferably, from about 100° C. to about 350° C. In other embodiments, the method further provides transferring each of the wafers into a cool-down zone subsequent to depositing the gallium arsenide active layer. Thereafter, each wafer is cooled to a predetermined temperature within a range from about 18° C. to about 30° C. while in the cool-down zone.

In other embodiments, the wafers pass through a heat-up zone prior to entering the first deposition zone and the wafers pass through a cool-down zone subsequent to exiting the fourth deposition zone. The heat-up zone, the first deposition zone, the second deposition zone, the third deposition zone, the fourth deposition zone, and the cool-down zone share a common linear path. Optionally, additional deposition zones, such as a fifth, sixth, seventh, or more, may also share the common linear path. The method provides the wafers continuously and horizontally advance along the common linear path within the deposition system.

In other embodiments, the method further provides flowing at least one gas between each of the deposition zones to form gas curtains therebetween. In some embodiments, the gas curtains or isolation curtains contain or are formed from at least one gas, such as hydrogen, arsine, a mixture of hydrogen and arsine, nitrogen, argon, or combinations thereof. In many examples, a mixture of hydrogen and arsine is utilized to form the gas curtains or isolation curtains.

In another embodiment, a method for forming a multi-layered material during a continuous CVD process is provided which includes continuously advancing a plurality of wafers through a deposition system, wherein the deposition system has a heat-up zone, a first deposition zone, a second deposition zone, a third deposition zone, a fourth deposition zone, and a cool-down zone. The method further provides depositing a gallium arsenide buffer layer on a first wafer within the first deposition zone, then depositing an aluminum arsenide sacrificial layer on the first wafer within the second deposition zone, while depositing the gallium arsenide buffer layer on a second wafer within the first deposition zone. The method further provides depositing an aluminum gallium arsenide passivation layer on the first wafer within the third deposition zone, while depositing the aluminum arsenide sacrificial layer on the second wafer within the second deposition zone, and while depositing the gallium arsenide buffer layer on a third wafer within the first deposition zone. The method further provides depositing a gallium arsenide active layer on the first wafer within the fourth deposition zone, while depositing the aluminum gallium arsenide passivation layer on the second wafer within the third deposition zone, while depositing the aluminum arsenide sacrificial layer on the third wafer within the second deposition zone, and while depositing the gallium arsenide buffer layer on a fourth wafer within the first deposition zone.

Other embodiments of the invention generally relate to the CVD reactor system and related methods of use. In one embodiment, the CVD system is provided which includes a lid assembly, such as a top plate, having a plurality of raised portions located along the longitudinal axis of the top plate. The system includes a track having a guide path, such as a channel, located along the longitudinal axis of the track, wherein the channel is adapted to receive the plurality of raised portions of the top plate, thereby forming a gap between the plurality of raised portions and a floor of the track, wherein the gap is configured to receive a substrate. The system includes a heating assembly, such as a heating element, operable to heat the substrate as the substrate moves along the channel of the track. In one embodiment, the track is operable to float the substrate along the channel of the track.

In one embodiment, system includes a trough that supports the track. The gap may have a thickness within a range from about 0.5 mm to about 5 mm or from about 0.5 mm to about 1 mm. The top plate is formed from molybdenum or quartz, the track is formed from quartz or silica. The top plate is operable to direct a gas to the gap and may further include a plurality of ports located along the longitudinal axis of the top plate and disposed between the plurality of raised portions, thereby defining paths between the plurality of raised portions. One or more of the plurality of ports is adapted to communicate and/or exhaust a gas to the gap between plurality of raised portions of the top plate and the floor of the track.

Examples of the heating element include a heating lamp coupled to or with the track, a plurality of heating lamps disposed along the track, a heating lamp bank operable to move along the track as the substrate moves along the channel of the track, resistive heaters coupled to or with the track, an inductive heating source coupled to or with the substrate and/or the track. The heating element is operable to maintain a temperature differential across the substrate, wherein the temperature differential is less than 10° C. In one embodiment, the CVD system is an atmospheric pressure CVD system.

In one embodiment, the CVD system is provided which includes an entrance isolator operable to prevent contaminants from entering the system at an entrance of the system, an exit isolator operable to prevent contaminants from entering the system at an exit of the system, and an intermediate isolator disposed between the entrance and exit isolators. The system may further include a first deposition zone disposed adjacent the entrance isolator and a second deposition zone disposed adjacent the exit isolator. The intermediate isolator is disposed between the deposition zones and is operable to prevent mixing of gases between the first deposition zone and the second deposition zone.

In one embodiment, the entrance isolator is further operable to prevent back diffusion of gases injected into the first deposition zone, the intermediate isolator is further operable to prevent back diffusion of gases injected into the second deposition zone, and the exit isolator is further operable to prevent back diffusion of gases injected into the second deposition zone. An isolation zone formed by at least one of the isolators has a length within a range from about 1 meter to about 2 meters. A gas, such as nitrogen, is injected into the entrance isolator at a first flow rate, such as about 30 liters per minute, to prevent back diffusion of gases from the first deposition zone. A gas, such as arsine, is injected into the intermediate isolator at a first flow rate, such as about 3 liters per minute, to prevent back mixing of gases between the first deposition zone and the second deposition zone. A gas, such as nitrogen, is injected into the exit isolator at a first flow rate, such as about 30 liters per minute, to prevent contaminants from entering the system at the exit of the system. In one embodiment, an exhaust is disposed adjacent each isolator and operable to exhaust gases injected by the isolators. An exhaust may be disposed adjacent each deposition zone and operable to exhaust gases injected into the deposition zones.

In one embodiment, the CVD system is provided which includes a housing, a track surrounded by the housing, wherein the track defines a guide path, such as a channel, adapted to guide the substrate through the CVD system. The system includes a carrier for moving the substrate along the channel of the track, wherein the track is operable to levitate the carrier along the channel of the track. The housing is formed from molybdenum, quartz, or stainless steel, the track is formed from quartz, molybdenum, fused silica, ceramic, and the carrier is formed from graphite.

In one embodiment, the track has a plurality of openings and/or a conduit disposed along the floor of the track each operable to supply a cushion of gas to the channel and the bottom surface of the carrier to lift or levitate the carrier and substantially center the carrier along the channel of the track. The conduit may have a v-shape and the carrier may have a notch (e.g., v-shape) disposed along its bottom surface. A gas is applied to the notch of the carrier to substantially lift the carrier from the floor of the track and to substantially center the carrier along the channel of the track. The track may be tilted, such as at an angle less than about ten, twenty, or between one and five degrees, to allow the substrate to move and float from a first end of the channel to a second end of the channel. The track and/or housing may include multiple segments.

In one embodiment, the system may include a conveyor operable to automatically introduce substrates into the channel, a retriever operable to automatically retrieve substrates from the channel, and/or a heating element operable to heat the substrate. The heating element is coupled to or with the housing, the substrate, and/or the track. The carrier is operable to carry strips of the substrate along the channel of the track.

In one embodiment, a track assembly for moving a substrate through the CVD system is provided which includes a top section having a floor, side supports, such as a pair of rails, disposed adjacent the floor, thereby defining a guide path, such as a channel, to guide the substrate along the floor. A bottom section is coupled to or with the top section to form one or more chambers therebetween. The top section may include a recessed bottom surface and the bottom section may include a recessed top surface to form the chamber. In one embodiment the top section and/or the bottom section is formed from molybdenum, quartz, silica, alumina, or ceramic.

In one embodiment, the top section has a plurality of openings disposed through the floor to provide fluid communication between the chamber and the channel. A cushion of gas, such as nitrogen, is supplied from the chamber to the channel to substantially lift and carry the substrate from and along the floor of the top section. The floor may be tilted, such as at an angle less than about ten, twenty, or between one and five degrees, to allow the substrate to move and float from a first end of the channel to a second end of the channel.

In one embodiment, the top section has a plurality of openings disposed through the pair of rails adjacent the floor. A gas is supplied through the plurality of openings to substantially center the substrate moving along the channel of the top section. The floor may also include a tapered profile and/or a conduit through which a gas is supplied each operable to substantially center the substrate moving along the channel of the top section. The conduit may have a v-shape and/or the substrate may have a notch (e.g., v-shaped) for receiving a gas cushion disposed along a bottom surface of the substrate operable to substantially center the substrate moving along the channel of the top section.

In one embodiment, the track assembly may include a conveyor operable to automatically introduce substrates into the channel and/or a retriever operable to automatically retrieve substrates from the channel. An injection line may be coupled to or with the bottom section to supply a gas to the chamber through the floor to substantially float the substrate along the floor of the top section. The top section may further include recessed portions adjacent the rails operable to receive reactor lid assembly, such as a top plate. The track assembly may include a trough in which the top section and bottom section are seated. The trough is formed from quartz, molybdenum, or stainless steel.

In one embodiment, a method for forming a multi-layered material during the CVD process is provided which includes forming a gallium arsenide buffer layer on a gallium arsenide substrate, forming an aluminum arsenide sacrificial layer on the buffer layer, and forming an aluminum gallium arsenide passivation layer on the sacrificial layer. The method may further include forming a gallium arsenide active layer (e.g., at about 1,000 nm thick) on the passivation layer. The method may further include forming a phosphorous gallium arsenide layer on the active layer. The method may further include removing the sacrificial layer to separate the active layer from the substrate. The aluminum arsenide sacrificial layer may be exposed to an etching solution while the gallium arsenide active layer is separated from the substrate during an epitaxial lift off process. The method may further include forming additional multi-layered materials on the substrate during a subsequent CVD process. The buffer layer may be about 300 nm in thickness, the passivation layer may be about 30 nm in thickness, and/or the sacrificial layer may be about 5 nm in thickness.

In one embodiment, a method for forming multiple epitaxial layers on a substrate using the CVD system is provided which includes introducing the substrate into a guide path, such as a channel, at an entrance of the system, while preventing contaminants from entering the system at the entrance, depositing a first epitaxial layer on the substrate, while the substrate moves along the channel of the system, depositing a second epitaxial layer on the substrate, while the substrate moves along the channel of the system, preventing mixing of gases between the first deposition step and the second deposition step, and retrieving the substrate from the channel at an exit of the system, while preventing contaminants from entering the system at the exit. The method may further include heating the substrate prior to depositing the first epitaxial layer, maintaining the temperature of the substrate as the first and second epitaxial layers are deposited on the substrate, and/or cooling the substrate after depositing the second epitaxial layer. The substrate may substantially float along the channel of the system. The first epitaxial layer may include aluminum arsenide and/or the second epitaxial layer may include gallium arsenide. In one embodiment, the substrate substantially floats along the channel of the system. The method may further include depositing a phosphorous gallium arsenide layer on the substrate and/or heating the substrate to a temperature within a range from about 300° C. to about 800° C. during the depositing of the epitaxial layers. A center temperature to an edge temperature of the substrate may be within 10° C. of each other.

In one embodiment, the CVD reactor is provided which includes a lid assembly having a body, and a track assembly having a body and a guide path located along the longitudinal axis of the body. The body of the lid assembly and the body of the track assembly are coupled together to form a gap therebetween that is configured to receive a substrate. The reactor may further include a heating assembly containing a plurality of heating lamps disposed along the track assembly and operable to heat the substrate as the substrate moves along the guide path. The reactor may further include a track assembly support, wherein the track assembly is disposed in the track assembly support. The body of the track assembly may contain a gas cavity within and extending along the longitudinal axis of the body and a plurality of ports extending from the gas cavity to an upper surface of the guide path and configured to supply a gas cushion along the guide path. The body of the track assembly may contain quartz. The body of the lid assembly may include a plurality of ports configured to provide fluid communication to the guide path. The heating assembly may be operable to maintain a temperature differential across the substrate, wherein the temperature differential is less than 10° C. In one embodiment, the CVD reactor is an atmospheric pressure CVD reactor.

In one embodiment, the CVD system is provided which includes an entrance isolator operable to prevent contaminants from entering the system at an entrance of the system, an exit isolator operable to prevent contaminants from entering the system at an exit of the system, and an intermediate isolator disposed between the entrance and exit isolators. The system may further include a first deposition zone disposed adjacent the entrance isolator and a second deposition zone disposed adjacent the exit isolator. The intermediate isolator is disposed between the deposition zones and is operable to prevent mixing of gases between the first deposition zone and the second deposition zone. A gas is injected into the entrance isolator at a first flow rate to prevent back diffusion of gases from the first deposition zone, a gas is injected into the intermediate isolator at a first flow rate to prevent back mixing of gases between the first deposition zone and the second deposition zone, and/or a gas is injected into the exit isolator at a first flow rate to prevent contaminants from entering the system at the exit of the system. An exhaust may be disposed adjacent each isolator and operable to exhaust gases injected by the isolators and/or disposed adjacent each deposition zone and operable to exhaust gases injected into the deposition zones.

In one embodiment, the CVD system is provided which includes a housing, a track surrounded by the housing, wherein the track contains a guide path adapted to guide a substrate through the CVD system, and a substrate carrier for moving the substrate along the guide path, wherein the track is operable to levitate the substrate carrier along the guide path. The track may include a plurality of openings operable to supply a gas cushion to the guide path. The gas cushion is applied to a bottom surface of the substrate carrier to lift the substrate carrier from a floor of the track. The track may include a conduit disposed along the guide path and operable to substantially center the substrate carrier along the guide path of the track. A gas cushion may be supplied through the conduit to a bottom surface of the substrate carrier to substantially lift the substrate carrier from a floor of the track. The track may be tilted to allow the substrate to move from a first end of the guide path to a second end of the guide path. The system may include a heating assembly containing a plurality of heating lamps disposed along the track and operable to heat the substrate as the substrate moves along the guide path.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1A depicts a chemical vapor deposition (CVD) reactor according to one embodiment of the invention;

FIG. 9 depicts the reactor lid assembly and the wafer carrier track of the CVD reactor according to one embodiment described herein;

FIGS. 10B-10C depict a levitating wafer carrier according to another embodiment described herein;

FIGS. 10D-10F depict other levitating wafer carriers according to another embodiment described herein;

DETAILED DESCRIPTION

Embodiments of the invention generally relate to an apparatus and a method of chemical vapor deposition ("CVD"). As set forth herein, embodiments of the invention is described as they relate to an atmospheric pressure CVD reactor and metal-organic precursor gases. It is to be noted, however, that aspects of the invention are not limited to use with an atmospheric pressure CVD reactor or metal-organic precursor gases, but are applicable to other types of reactor systems and precursor gases. To better understand the novelty of the apparatus of the invention and the methods of use thereof, reference is hereafter made to the accompanying drawings.

According to one embodiment of the invention, an atmospheric pressure CVD reactor is provided. The CVD reactor may be used to provide multiple epitaxial layers on a substrate, such as a wafer, such as a gallium arsenide wafer. These epitaxial layers may include aluminum gallium arsenide, gallium arsenide, and phosphorous gallium arsenide. These epitaxial layers may be grown on the gallium arsenide wafer for later removal so that the wafer may be reused to generate additional materials. In one embodiment, the CVD reactor may be used to provide solar cells. These solar cells may further include single junction, heterojunction, or other configurations. In one embodiment, the CVD reactor may be configured to develop a wafer which produces about 2.5 watts and has the dimension of about 10 cm by about 10 cm. In one embodiment, the CVD reactor may provide a throughput range of about 1 wafer per minute to about 10 wafers per minute.

Figure 1B:
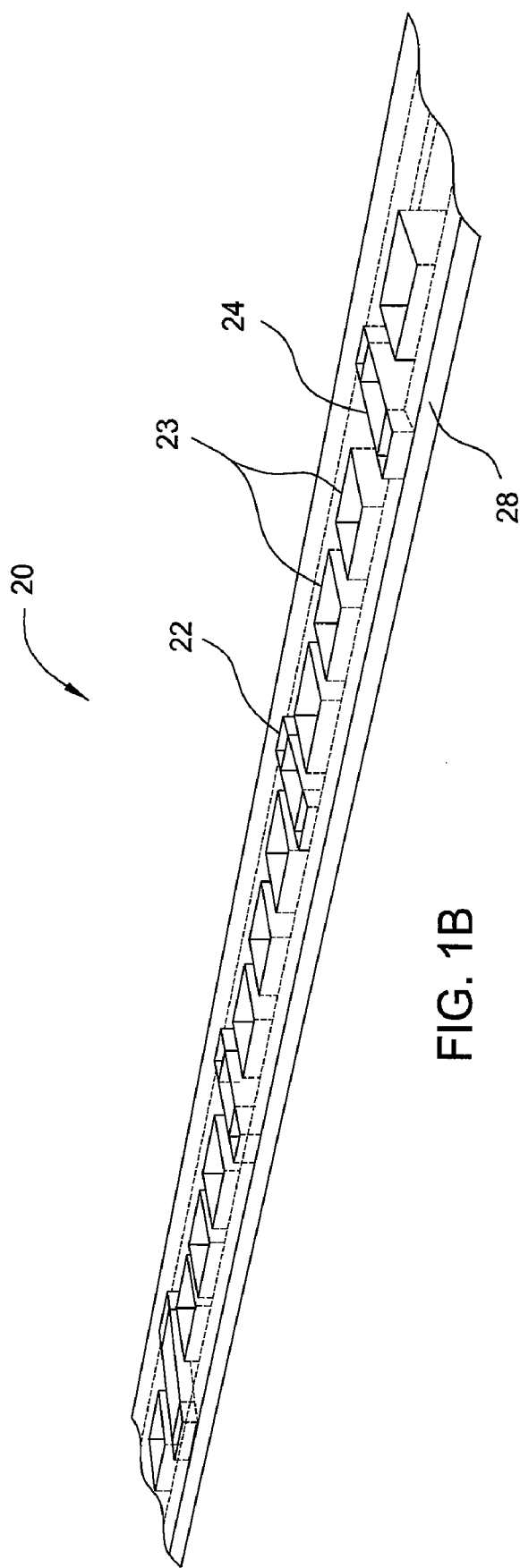
FIG. 1B depicts a perspective view of a reactor lid assembly according to one embodiment of the invention.

FIG. 1A shows a CVD reactor 10, according to one embodiment of the invention. The reactor 10 includes a reactor lid assembly 20, a wafer carrier track 30, a wafer carrier track support 40, and a heating lamp assembly 50. The reactor lid assembly 20 may be formed from molybdenum, molybdenum alloys, stainless steel, and quartz. The reactor lid assembly 20 is disposed on the wafer carrier track 30. The wafer carrier track 30 may be formed from quartz, molybdenum, silica (such as fused silica), alumina, or other ceramic materials. The wafer carrier track 30 may be seated in a wafer carrier track support 40. The wafer carrier track support 40 may be formed from quartz or a metal, such as molybdenum, molybdenum alloys, steel, stainless steel, nickel, chromium, iron, or alloys thereof. Finally, a heating lamp assembly 50 (further discussed below with respect to FIG. 10) is disposed below the wafer carrier track support 40. The overall CVD reactor length may be in a range of about 18 feet to about 25 feet, but may extend beyond this range for different applications.

Figure 2:
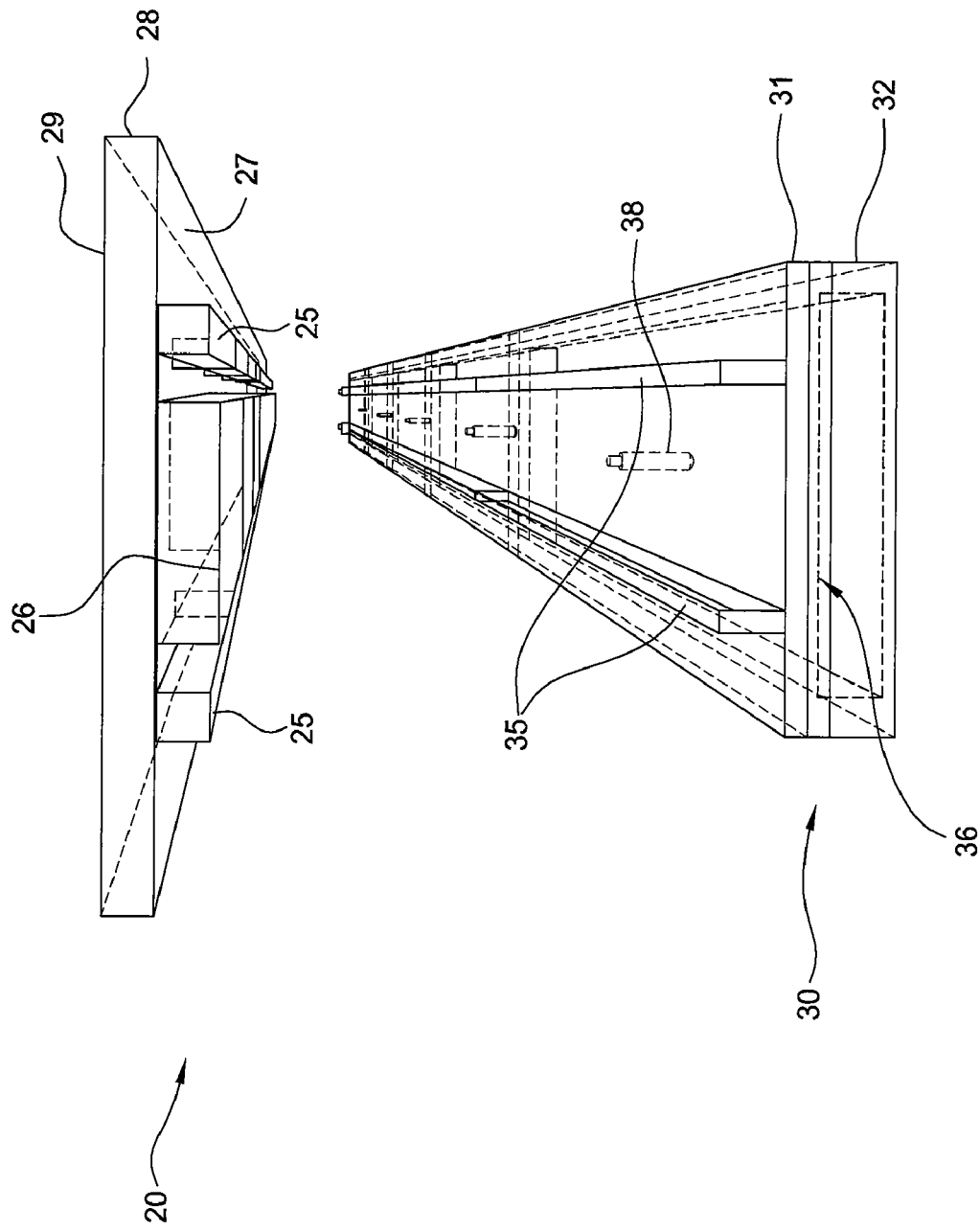
FIG. 2 depicts a side perspective view of the CVD reactor according to one embodiment described herein.

FIGS. 1B, 2, 3, and 4A provide various views of embodiments of the reactor lid assembly 20. Referring to FIG. 2, the reactor lid assembly 20 forms a rectangular body having sidewalls 25 extending from the bottom surface of the reactor lid assembly 20, and having a plurality of raised portions 26 centrally located between the sidewalls 25. The raised portions 26 may extend from the bottom surface of the top plate at different lengths along the reactor lid assembly 20. The raised portions 26 are disposed between the sidewalls 25 so that clearances are formed between the raised portions 26 and each sidewall 25. These clearances may be used to help couple the reactor lid assembly 20 to the track 30 (further described below). Both the sidewalls 25 and the raised portions 26 may extend substantially the longitudinal length of the reactor lid assembly 20. The reactor lid assembly 20 may be formed as a single solid structural component, or it may be constructed from several segments coupled together. The raised portions 26 may vary in length and number, thereby forming zones which may be utilized for different applications in a CVD process. The reactor lid assembly 20 may also include multiple patterns of raised portions 26 along its length, such as to develop numerous layouts or stages in a CVD process.

Figure 3:
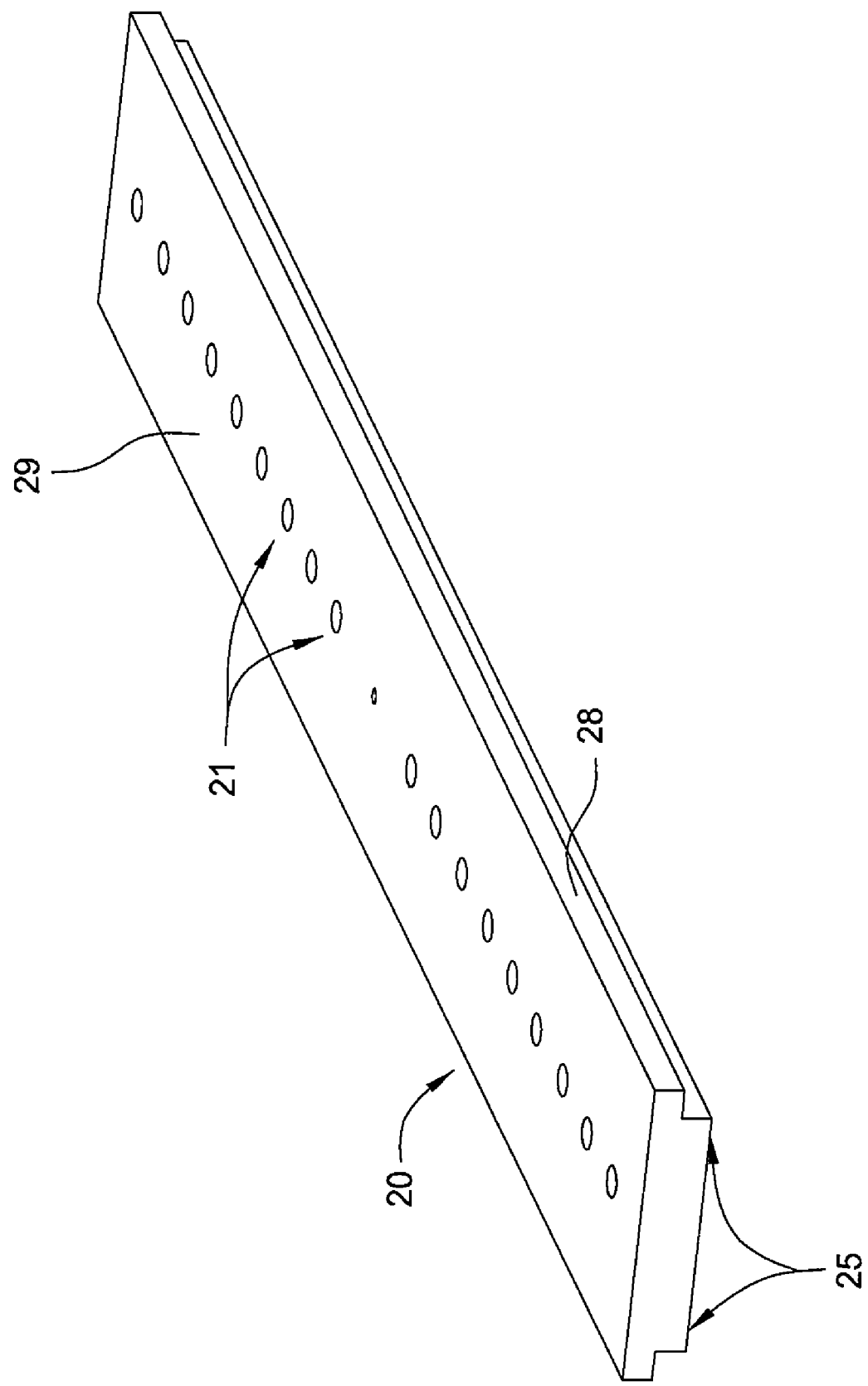
FIG. 3 depicts a reactor lid assembly of the CVD reactor according to one embodiment described herein.

FIG. 3 also shows the reactor lid assembly 20. As stated above, the reactor lid assembly 20 as shown in FIG. 3 may represent an entire top plate structure or a single segment of a larger constructed top plate structure. Also shown, is a plurality of ports 21 disposed through the top surface of the reactor lid assembly 20 and centrally located along the longitudinal axis of the reactor lid assembly 20. The ports 21 may vary in size, shape, number, and location along the top surface of the reactor lid assembly 20. The ports 21 may be used as injection, deposition, and/or exhaust ports for communicating a gas, into the CVD reactor. Generally, each port 21 is disposed between two adjacent raised portions 26 (as show in FIG. 2), thereby forming paths through which injection, deposition, and/or exhaustion of a gas may take place. In one example, a gas may be injected into a port 21 so that the gas first travels along the sides of the adjacent raised portions 26 and then travels along the bottom surfaces of the raised portions 26 and into the flow path of a substrate. As shown in FIG. 3, the sidewalls 25 are enclosed at the ends of the reactor lid assembly 20 to encapsulate any fluids that are communicated to the zones and paths created by the ports 21 and the raised portions 26 of the reactor lid assembly 20.

Figure 4:
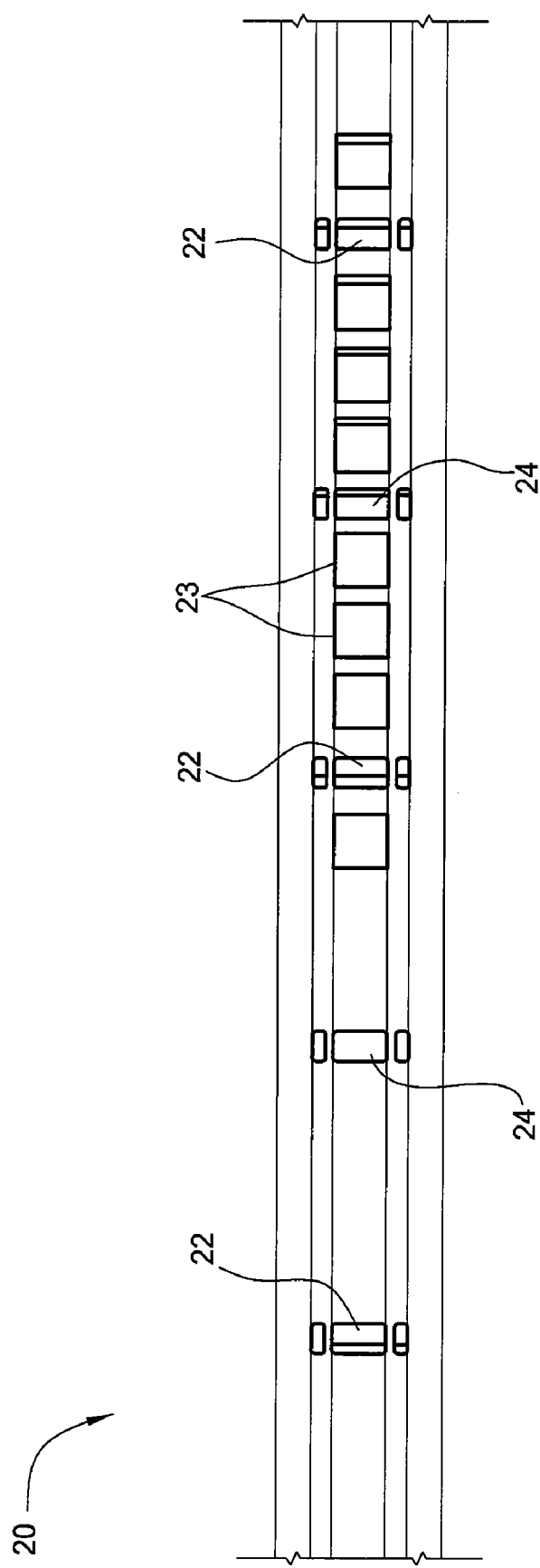
FIG. 4 depicts a top view of a reactor lid assembly of the CVD reactor according to another embodiment described herein.

FIG. 4 shows a top view of the reactor lid assembly 20, according to one embodiment, having one or more openings, such as deposition ports 23, exhaust ports 22, and injection ports 24 (also shown in FIG. 1B) disposed through the body 28. The openings may be disposed through the body 28 from the upper surface 29 to the lower surface 27. These ports may be fitted with removable isolator, showerhead, exhaust, or other gas manifold assemblies, which may extend beyond the lower surface 27 of the body 28, to facilitate distribution of a gas, into and/or out of the CVD reactor, and specifically to uniformly apply the gas to a wafer passing beneath the assemblies. In one embodiment, the ports 22, 23, 24 may define a circular shape, a square shape, a rectangular shape, or combinations thereof. In one embodiment, the showerhead assemblies may include injection hole diameters within the range of about 0.1 mm to about 5 mm and may include injection hole spacing within the range of about 1 mm to about 30 mm. These dimensions may extend beyond these ranges for different applications. The gas manifold assemblies and the reactor lid assembly 20 may be configured to provide a high reactant utilization, meaning that the gases utilized in the reactor are nearly 100 percent consumed by the reactions during the CVD process.

Figure 19:
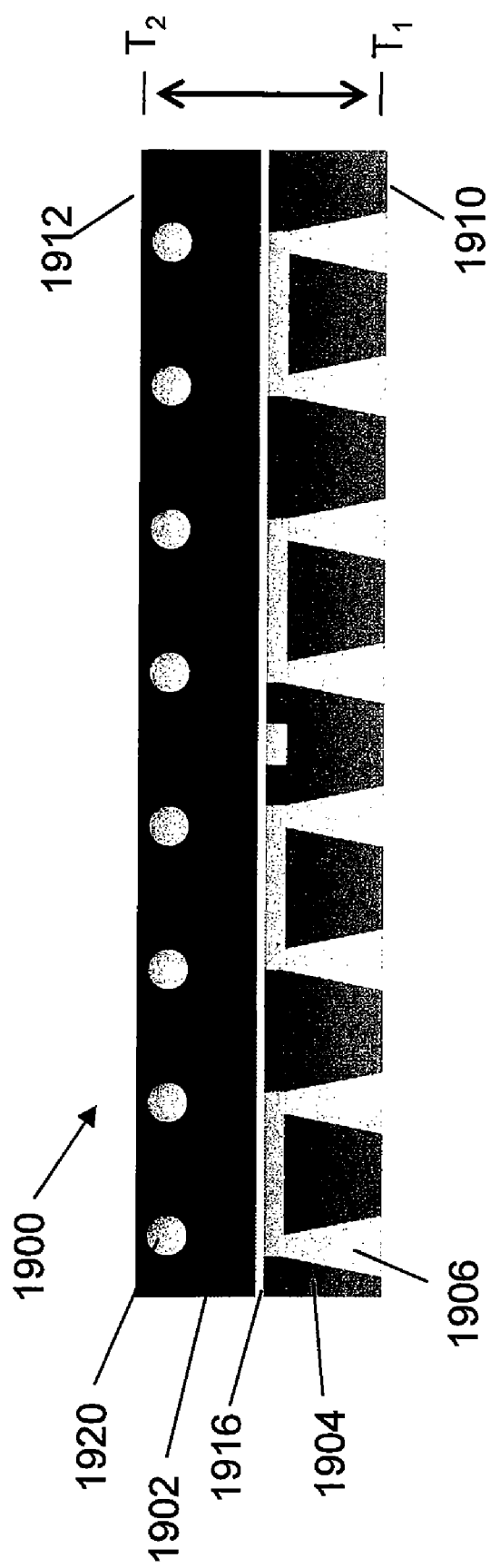
FIG. 19 depicts a cooling showerhead according to one embodiment described herein.

FIG. 19 depicts a cooling showerhead 1900 as described in one embodiment herein. The cooling showerhead 1900 may be incorporated into the reactor lid assembly 20 within one or more openings, such as deposition ports 23. The cooling showerhead 1900 may have a cooling plate 1902 extending across the upper portion of the cooling showerhead 1900 and in thermal communication with at least one gas distribution plate 1904. Each of the gas distribution plate 1904 contains a plurality of shower holes 1906 for distributing or otherwise flowing gases therethrough. The cooling showerhead 1900, the cooling plate 1902, and the distribution plates 1904 may each independently be made from or contain steel, stainless steel, aluminum, other metals. In one example, each of the cooling showerhead 1900, the cooling plate 1902, and the distribution plates 1904 each contain 316 stainless steel. The cooling showerhead 1900 may have a thickness from about 20 mm to about 40 mm.

Heat dissipates through the cooling showerhead 1900 and creates a temperature gradient across the thickness of the cooling showerhead 1900. The cooling showerhead 1900 may be heated to a temperature within a range from about 20° C. to about 750° C. In one example, the front face 1910 of the cooling showerhead 1900 is heated to a temperature ($T_1$) of about 300° C., while the rear face 1912 is cooled to a temperature ($T_2$) of about 50° C. In another embodiment, the cooling showerhead 1900 may have multiple stackable gas distribution plates 1904, which may be joined together by a braze layer 1916 in order to form a multi-level hierarchical distribution or separated multi-source distribution.

A cooling fluid 1920 may be used to circulate within the cooling plate 1902 and transfers heat energy away from the front face of the distribution plate 1904 and to a cooling reservoir (not shown). Water, alcohol solutions, glycol solutions, and/or other fluids may be used to transfer heat away from the front face of the cooling showerhead 1900 and away from the reactor lid assembly 20.

The exhaust ports 22 and the injection ports 24 may be used to develop "gas curtains" or "isolation curtains" to help prevent contamination and to help prevent back diffusion of the gases introduced into the CVD reactor 10 between the various zones created in the reactor. These gas curtains or isolation curtains may be introduced at the front end (entrance) and the back end (exit) of the CVD reactor 10, as well as between the various zones created within the CVD reactor 10. In one example, nitrogen or argon may be injected into an injection port 24 to purge contaminants, such as oxygen, out of a particular zone, which are then exhausted out of an adjacent exhaust port 22. By utilizing the gas curtains or isolation curtains with the paths and zones created by the reactor lid assembly 20, the CVD reactor 10 limits the gas isolation to a two dimension configuration that protects between zones and isolates the reactor from outside contaminants, such as air.

FIGS. 2, 5, 6, 7, and 8 provide various views of embodiments of the wafer carrier track 30. The wafer carrier track 30 may provide a levitation-type system so that a wafer may float across a cushion of a gas, such as nitrogen or argon, supplied from the gas holes 33 of the wafer carrier track 30. Referring back to FIG. 2, the wafer carrier track 30 generally may be a rectangular body having an upper portion 31 and a lower portion 32. The upper portion 31 includes side surfaces 35 extending from the top surface of the wafer carrier track 30 and disposed along the longitudinal length of the wafer carrier track 30, thereby forming a "guide path" along which a wafer travels through the CVD reactor. The width of the guide path (e.g., the distance between the inner sides of the side surfaces 35) may be in a range of about 110 mm to about 130 mm, the height of the guide path may be in a range of about 30 mm to about 50 mm, and the length of the guide path may be in a range of about 970 mm to about 1,030 mm, however, these dimensions may extend beyond these ranges for different applications. The upper portion 31 may include a recessed bottom surface, and the bottom section may include a recessed top surface, such that when joined together, a gas cavity 36 is formed therebetween. The gas cavity 36 may be used to circulate and distribute gas that is injected into the gas cavity 36 to the guide path of the wafer carrier track 30 to generate the cushion of gas. The number, size, shape, and location of the gas cavity 36 along the wafer carrier track 30 may vary. Both the side surfaces 35 and the gas cavity 36 may extent substantially the longitudinal length of the wafer carrier track 30. The wafer carrier track 30 may be formed as a single solid structural component, or it may be constructed from several segments coupled together. In one embodiment, the wafer carrier track 30 may be tilted at an angle, such that the entrance is elevated above the exit, so that the wafers may float down the track with the aid of gravity. As discussed above, the side surfaces 35 of the wafer carrier track 30 may be received into the gaps formed between the raised portions 26 and the flange members 25 of the reactor lid assembly 20 to enclose the "guide path" along the wafer carrier track 30 and to further compassing the zones formed with the raised portions 26 along the wafer carrier track 30.

Figure 5:
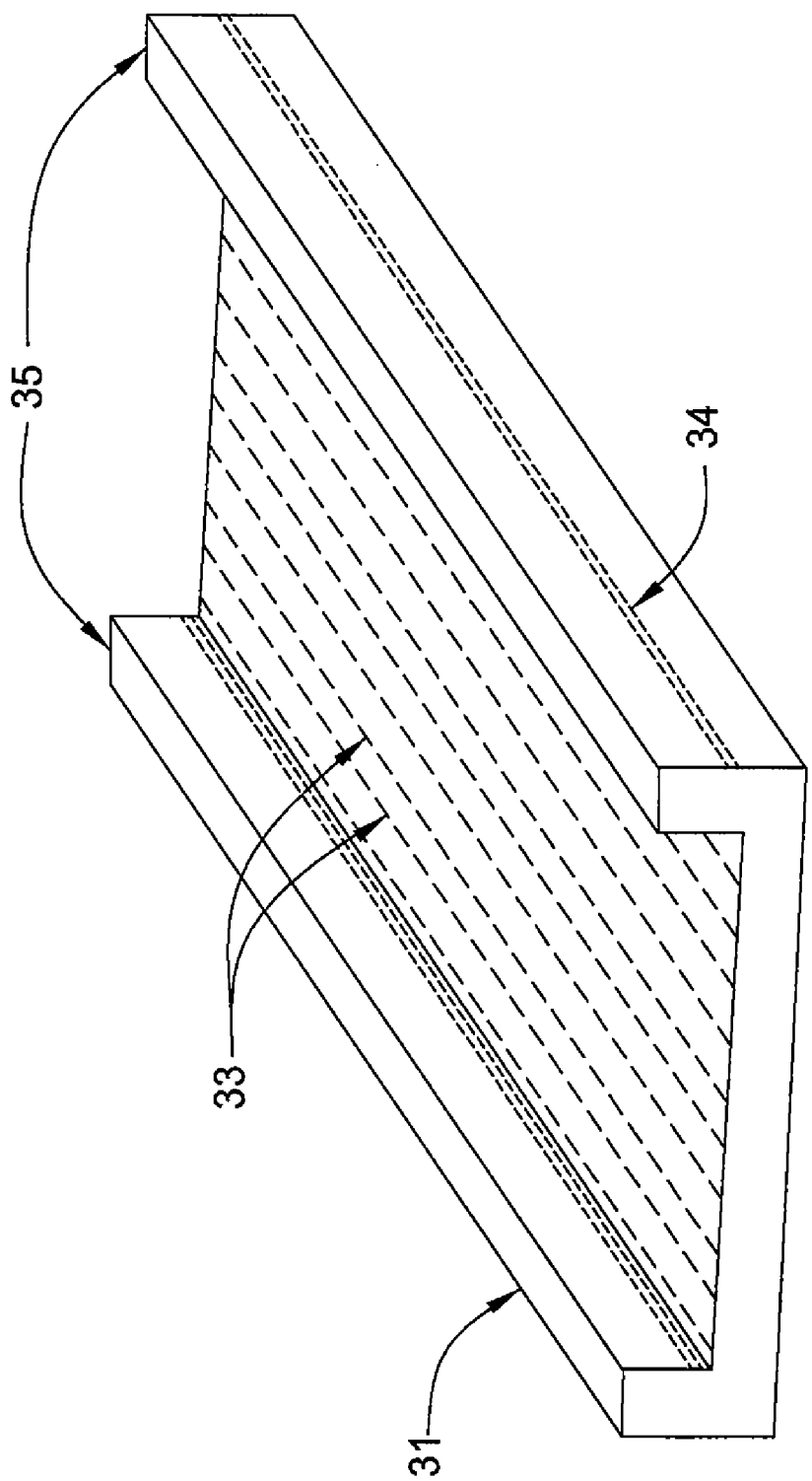
FIG. 5 depicts a wafer carrier track of the CVD reactor according to one embodiment described herein.

FIG. 5 shows an embodiment of the wafer carrier track 30. As shown, wafer carrier track 30 includes a plurality of gas holes 33 along the guide path of the wafer carrier track 30 and between the side surfaces 35. The gas holes 33 may be uniformly disposed along the guide path of the wafer carrier track 30 in multiple rows. The diameter of the gas holes 33 may include a range of about 0.2 mm to about 0.10 mm and the pitch of the gas holes 33 may include a range of about 10 mm to about 30 mm, but these dimensions may extend beyond these ranges for different applications. The number, size, shape, and location of the gas holes 33 along the wafer carrier track 30 may vary. In an alternative embodiment, the gas holes 33 may include rows of rectangular slits or slots disposed along the guide path of the wafer carrier track 30.

Gas holes 33 are in communication with the gas cavity 36 disposed beneath the guide path of the wafer carrier track 30. Gas that is supplied to the gas cavity 36 is uniformly released through the gas holes 33 to develop a cushion of gas along the wafer carrier track 30. A wafer positioned on the guide path of the wafer carrier track 30 may be levitated by the gas supplied from underneath and easily transported along the guide path of the wafer carrier track 30. The gap between a levitated wafer and the guide path of the wafer carrier track 30 may be greater than about 0.05 mm, but may vary depending on different applications. This levitation-type system reduces any drag effects produced by continuous direct contact with the guide path of the wafer carrier track 30. In addition, gas ports 34 may be provided along the sides of the side surfaces 35 adjacent the guide path of the wafer carrier track 30. These gas ports 34 may be used as an exhaust for the gas that is supplied through the gas holes 33. Alternatively, these gas ports 34 may be used to inject gas laterally into the center of the wafer carrier track 30 to help stabilize and center a wafer that is floating along the guide path of the wafer carrier track 30. In an alternative embodiment, the guide path of the wafer carrier track 30 may include a tapered profile to help stabilize and center a wafer that is floating along the guide path of the wafer carrier track 30.

Figure 6:
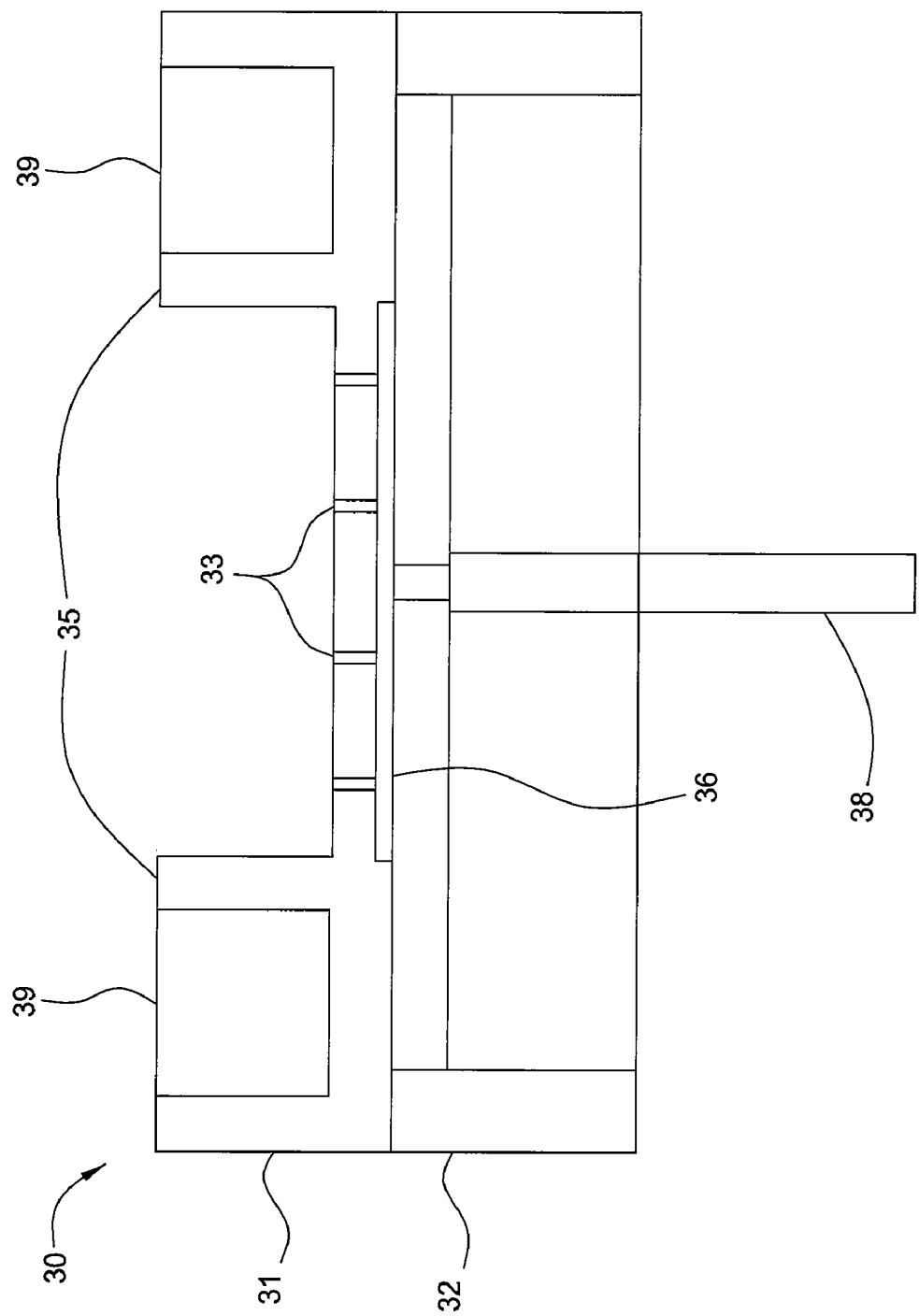
FIG. 6 depicts a front view of the wafer carrier track of the CVD reactor according to one embodiment described herein.

FIG. 6 shows a front view embodiment of the wafer carrier track 30. As shown, the wafer carrier track 30 includes the upper portion 31 and the lower portion 32. The upper portion 31 includes side surfaces 35 that form the "guide path" along the length of the wafer carrier track 30. The upper portion 31 may further include side surfaces 35 that form recessed portions 39 between the sides of the side surfaces 35. These recessed portions 39 may be adapted to receive the flange members 25 of the reactor lid assembly 20 (shown in FIG. 2) to couple the reactor lid assembly 20 and the wafer carrier track 30 together and enclose the guide path along the wafer carrier track 30. Also show in FIG. 5 are gas holes 33 extending from the guide path of the wafer carrier track 30 to the gas cavity 36. The lower portion 32 may act as a support for the upper portion 31 and may include a recessed bottom surface. An injection line 38 may be connected to the lower portion 32 so that gas may be injected through the line 38 and into the gas cavity 36.

Figure 7:
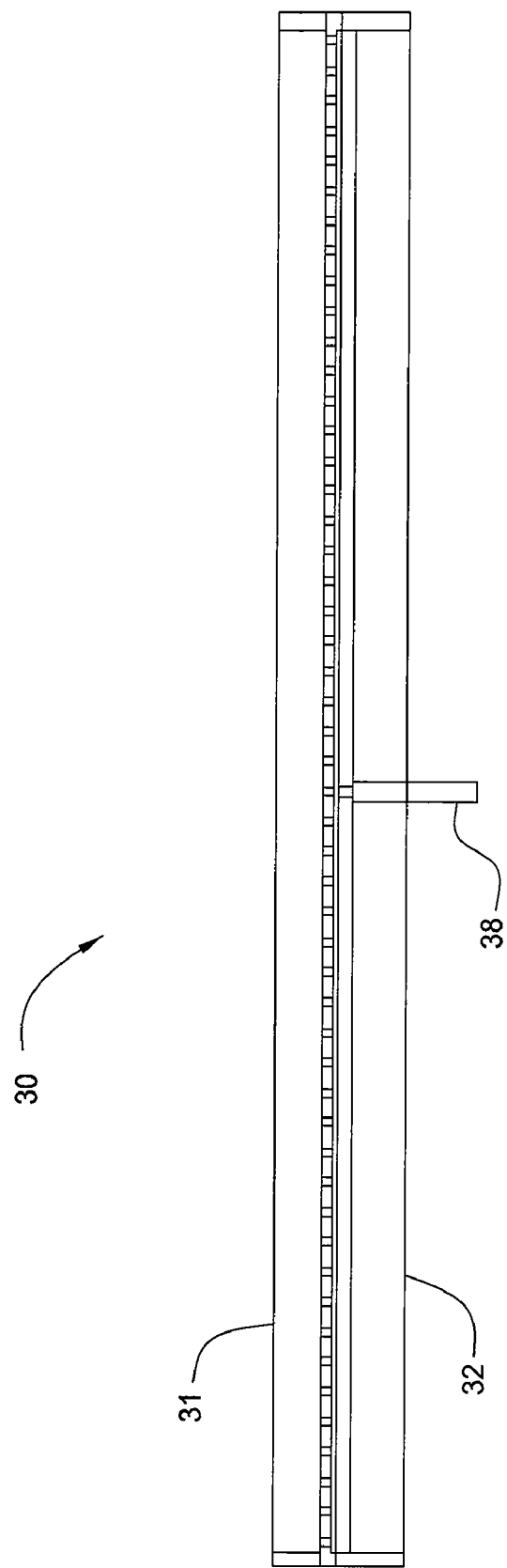
FIG. 7 depicts a side view of the wafer carrier track of the CVD reactor according to one embodiment described herein.

FIG. 7 shows a side view of the wafer carrier track 30 having a single injection line 38 into a gas cavity 36 along the entire wafer carrier track 30 length. Alternatively, the wafer carrier track 30 may include multiple gas cavities 36 and multiple injection lines 38 along its length. Alternatively still, the wafer carrier track 30 may include multiple segments, each segment having a single gas cavity and a single injection line 38. Alternatively still, the wafer carrier track 30 may include combinations of the above described gas cavity 36 and injection line 38 configurations.

Figure 8:
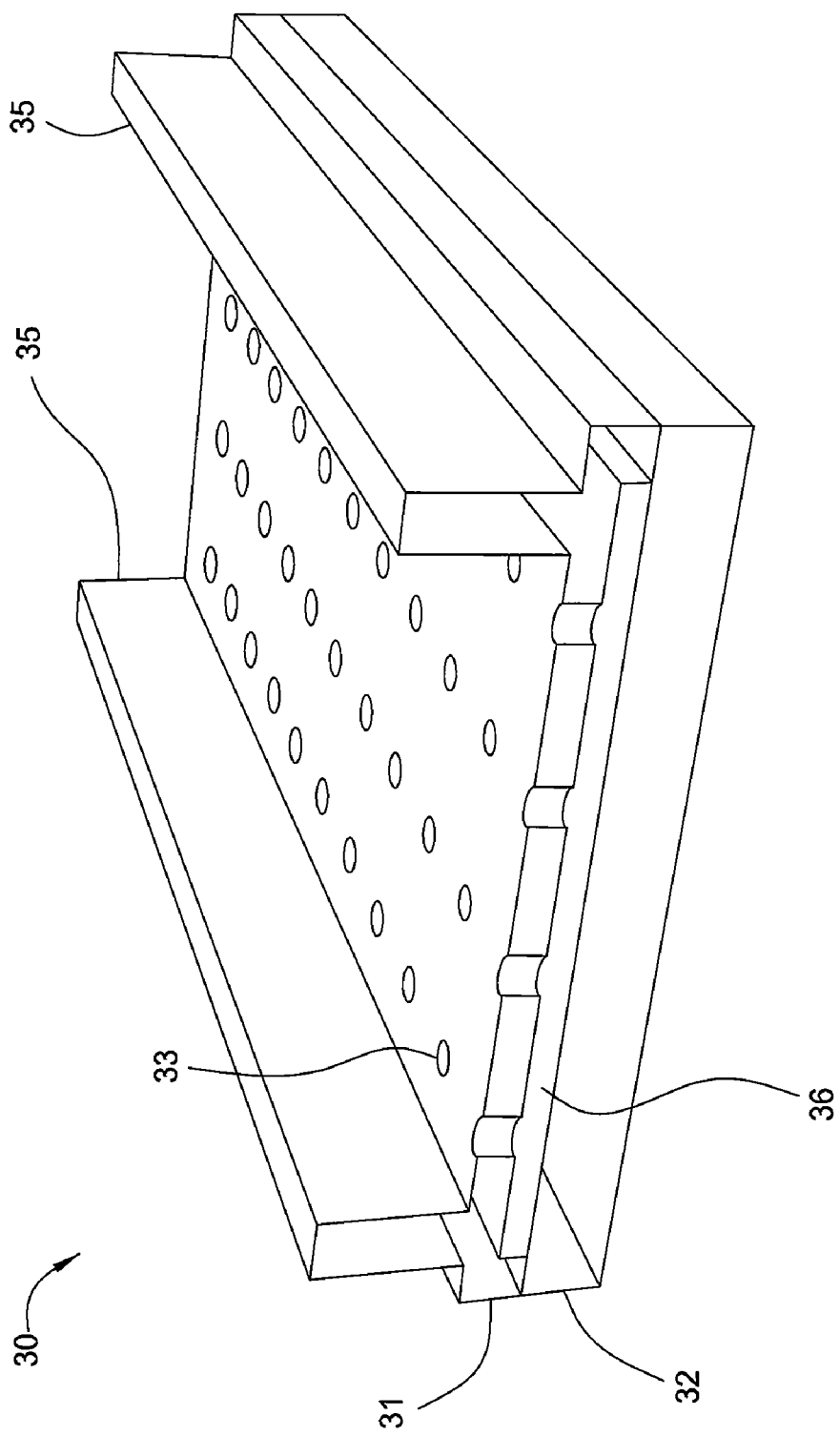
FIG. 8 depicts a perspective view of the wafer carrier track of the CVD reactor according to one embodiment described herein.

FIG. 8 shows a cross sectional perspective view embodiment of the wafer carrier track 30 having the upper portion 31 and the lower portion 32. The upper portion 31 having side surfaces 35, gas holes 33, and the gas cavity 36 disposed on the lower portion 32. In this embodiment, the side surfaces 35 and the lower portion 32 are hollow, which may substantially reduce the weight of the wafer carrier track 30 and may enhance the thermal control of the wafer carrier track 30 relative to the wafers traveling along the wafer carrier track 30.

FIG. 9 shows the reactor lid assembly 20 coupled to or with the wafer carrier track 30. O-rings may be used to seal the reactor lid assembly 20 and wafer carrier track 30 interfaces. As shown, the entrance into the CVD reactor 10 may be sized to receive varying sizes of wafers. In one embodiment, a gap 60, formed between the raised portions 26 of the reactor lid assembly 20 and the guide path of the wafer carrier track 30, in which the wafer is received, is dimensioned to help prevent contaminants from entering the CVD reactor 10 at either end, dimensioned to help prevent back diffusion of gases between zones, and dimensioned to help ensure that the gases supplied to the wafer during the CVD process are uniformly distributed across the thickness of the gap and across the wafer. In one embodiment, the gap 60 may be formed between the lower surface of the reactor lid assembly 20 and the guide path of the wafer carrier track 30, In one embodiment, the gap 60 may be formed between the lower surface of the gas manifold assemblies and the guide path of the wafer carrier track 30, In one embodiment, the gap 60 may be within the range of about 0.5 mm to about 5 mm in thickness and may vary along the length of the reactor lid assembly 20 and wafer carrier track 30. In one embodiment, the wafer may have a length within the range of about 50 mm to about 150 mm, a width within the range of about 50 mm to about 150 mm, and a thickness within the range of about 0.5 mm to about 5 mm. In one embodiment, the wafer may include a base layer having individual strips of layers disposed on the base layer. The individual strips are treated in the CVD process. These individual strips may have a length of about 10 cm and a width of about 1 cm (although other sizes may be utilized as well), and may be formed in this manner to facilitate removal of the treated strips from the wafer and to reduce the stresses induced upon the treated strips during the CVD process. The CVD reactor 10 may be adapted to receive wafers having dimensions that extend beyond the above recited ranges for different applications.

The CVD reactor 10 may be adapted to provide an automatic and continuous feed and exit of wafers into and out of the reactor, such as with a conveyor-type system. A wafer may be fed into the CVD reactor 10 at one end of the reactor, by a conveyor for example, communicated through a CVD process, and removed at the opposite end of the reactor, by a retriever for example, using a manual and/or automated system. The CVD reactor 10 may be adapted to produce wafers within the range of one wafer about every 10 minutes to one wafer about every 10 seconds, and may extend beyond this range for different applications. In one embodiment, the CVD reactor 10 may be adapted to produce 6-10 treated wafers per minute.

In one embodiment, wafers are continuously feed into a CVD system or reactor, similar to the same as the CVD reactor 10, and are continuously and horizontally moved through multiple process zones within the CVD system. Multiple layers are grown or formed on each substrate. Each layer may be compositionally the same as the immediate underlayer or may be compositionally different as the immediate underlayer. In some embodiments, a wafer passes through a heat-up zone, a growth zone, and a cool-down zone while passing through the CVD system. In one example, a wafer may pass through the heat-up zone for about 3 minutes, pass through the growth zone for about 14 minutes, and then pass through the cool-down zone for about 3 minutes. The deposition zone may be broken down to sub-zones, separated by distance and isolators, such as optional gas curtains and vacuum isolators. In one example, each wafer passes through 7 different deposition sub-zones which are each isolated from each other. The wafer continuously moves through each sub-zone and spends a predetermined time in each zone, for example, about 2 minutes. Therefore, a single layer may be deposited on the wafer in each deposition sub-zone.

Figure 10A:
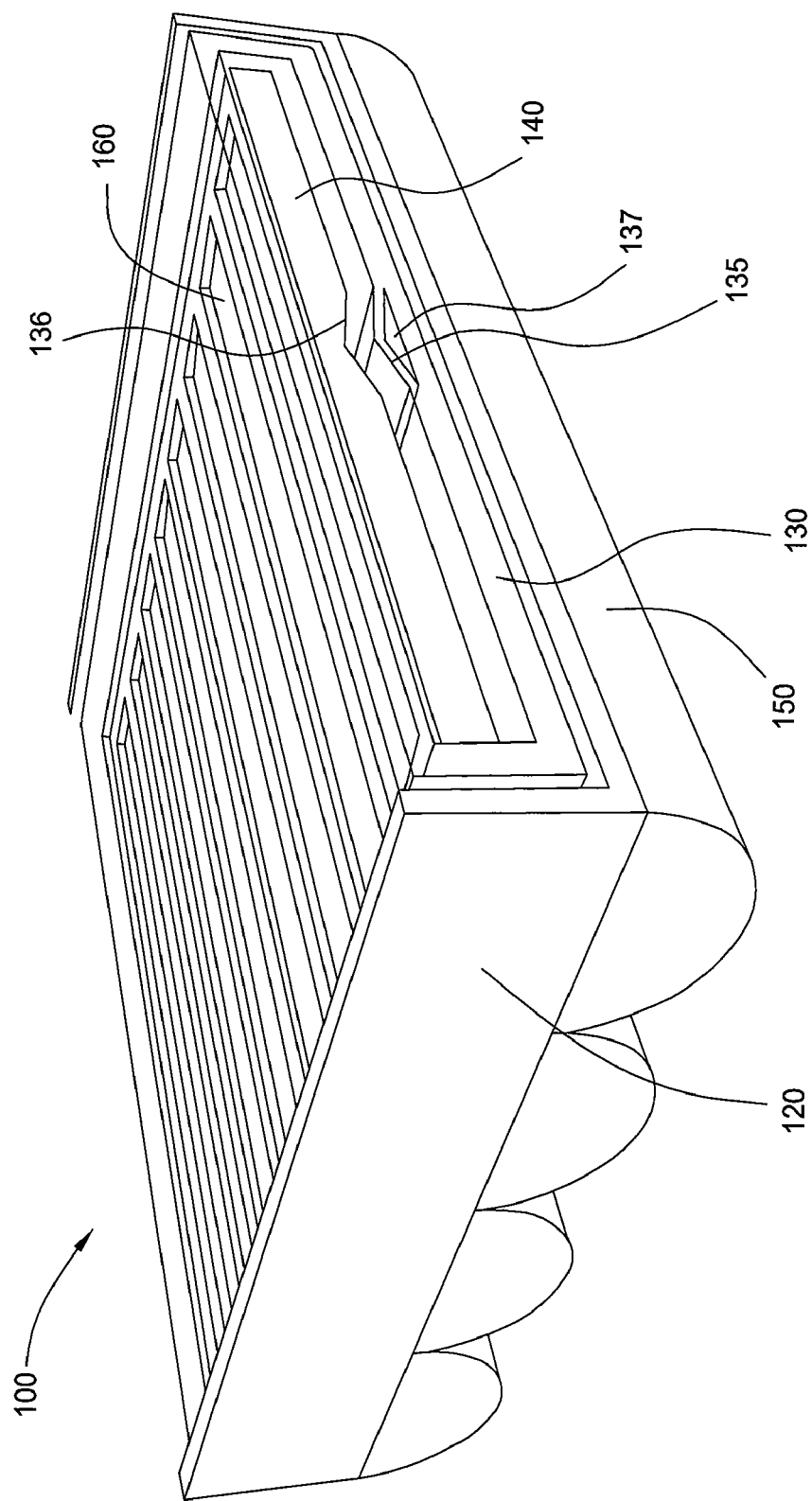
FIG. 10A depicts a CVD reactor according to one embodiment described herein.

FIG. 10A shows an alternative embodiment of a CVD reactor 100. The CVD reactor 100 includes a reactor body 120, a wafer carrier track 130, a wafer carrier 140, and a heating lamp assembly 150. The reactor body 120 may form a rectangular body and may be contain molybdenum, quartz, stainless steel, or other similar material. The reactor body 120 may enclose the wafer carrier track 130 and extend substantially the length of the wafer carrier track 130. The wafer carrier track 130 may also form a rectangular body and may contain quartz or other low thermal conductive material to assist with temperature distribution during the CVD process. The wafer carrier track 130 may be configured to provide a levitation-type system that supplies a cushion of gas to communicate a wafer along the wafer carrier track 130. As shown, a conduit, such as a gas cavity 137 having a v-shaped roof 135 is centrally located along the longitudinal axis of the guide path of the wafer carrier track 130. Gas is supplied through gas cavity 137 and is injected through gas holes in the roof 135 to supply the cushion of gas that floats a wafer having a corresponding v-shaped notch (not shown) on its bottom surface along the wafer carrier track 130. In one embodiment, the reactor body 120 and the wafer carrier track 130 each are a single structural component. In an alternative embodiment, the reactor body 120 includes multiple segments coupled together to form a complete structural component. In an alternative embodiment, the wafer carrier track 130 includes multiple segments coupled together to form a complete structural component.

Also shown in FIG. 10A is a wafer carrier 140 adapted to carry a single wafer (not shown) or strips 160 of a wafer along the wafer carrier track 130. The wafer carrier 140 may be formed from graphite or other similar material. In one embodiment, the wafer carrier 140 may have a v-shaped notch 136 along its bottom surface to correspond with the v-shaped roof 135 of the wafer carrier track 130. The v-shaped notch 136 disposed over the v-shaped roof 135 helps guide the wafer carrier 140 along the wafer carrier track 130. The wafer carrier 140 may be used to carry the wafer strips 160 through the CVD process to help reduce the thermal stresses imparted on the wafer during the process. Gas holes in the roof 135 of the gas cavity 137 may direct a cushion of gas along the bottom of the wafer carrier 140, which utilizes the corresponding v-shaped feature to help stabilize and center the wafer carrier 140, and thus the strips 160 of wafer, during the CVD process. As stated above, a wafer may be provided in strips 160 to facilitate removal of the treated strips from the wafer carrier 140 and to reduce the stresses induced upon the strips during the CVD process.

In another embodiment, FIGS. 10B-10F depict a wafer carrier 70 which may be used to carry a wafer through a variety of processing chambers including the CVD reactors as described herein, as well as other processing chambers used for deposition or etching. The wafer carrier 70 has short sides 71, long sides 73, an upper surface 72, and a lower surface 74. The wafer carrier 70 is illustrated with a rectangular geometry, but may also have a square geometry, a circular geometry, or other geometries. The wafer carrier 70 may contain or be formed from graphite or other materials. The wafer carrier 70 usually travels through the CVD reactor with the short sides 71 facing forward while the long sides 73 face towards the sides of the CVD reactor.

FIG. 10B illustrates a top view of the wafer carrier 70 containing 3 indentations 75 on the upper surface 72. Wafers may be positioned within the indentations 75 while being transferred through the CVD reactor during a process. Although illustrated with 3 indentations 75, the upper surface 72 may have more or less indentations, including no indentations. For example, the upper surface 72 of the wafer carrier 70 may contain 0, 1, 2, 3, 4, 5, 6, 7, 8, 9, 10, 12, or more indentations for containing wafers. In some example, one or multiple wafers may be disposed directly on the upper surface 72 which does not have an indentation.

FIG. 10C illustrates a bottom view of the wafer carrier 70 containing the indentation 78 on the lower surface 74, as described in one embodiment herein. The indentation 78 may be used to help levitate the wafer carrier 70 upon the introduction of a gas cushion under the wafer carrier 70. A gas flow may be directed at the indentation 78, which accumulates gas to form the gas cushion. The lower surface 74 of the wafer carrier 70 may have no indentations, or may have one indentation 78 (FIG. 10C), two indentations 78 (FIGS. 10D-10F), three indentations 78 (not shown) or more. The indentation 78 may have straight or tapered sides. In one example, the indentation 78 has tapered sides such that the sides 76 are steeper or more abrupt than the sides 77 which have more of a gradual change of angle. The sides 77 within the indentation 78 may be tapered to compensate for a thermal gradient across the wafer carrier 70. In another example, the indentation 78 has straight sides and tapered sides such that the sides 76 are straight and the sides 77 have a taper or the sides 77 are straight and the sides 76 have a taper. Alternatively, the indentation 78 may have all straight sides such that the sides 76 and 77 are straight.

Figure 10F:
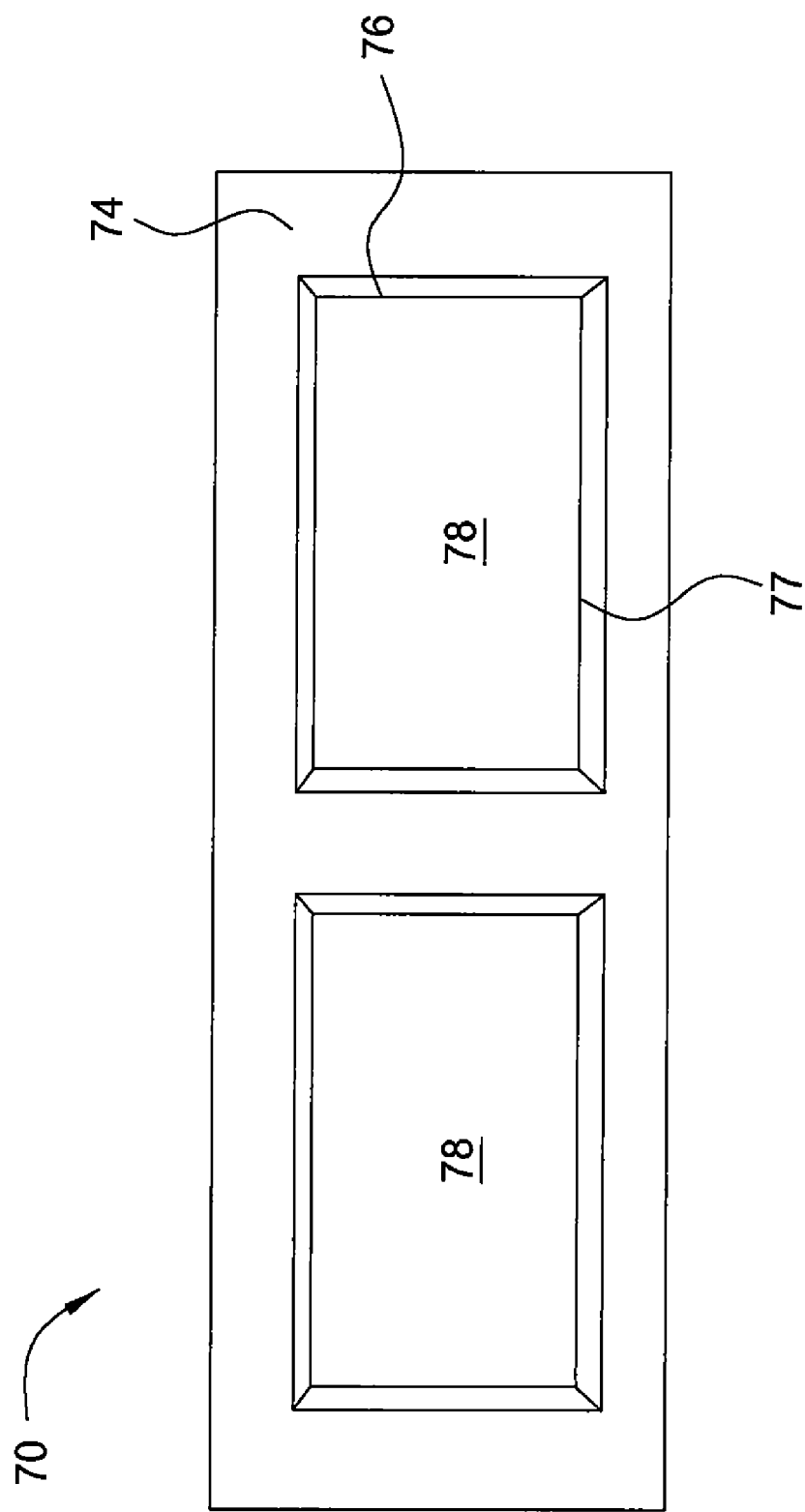

In another embodiment, FIGS. 10D-10F illustrate bottom views of the wafer carrier 70 containing two indentations 78 on the lower surface 74. The two indentations 78 help levitate the wafer carrier 70 upon the introduction of a gas cushion under the wafer carrier 70. A gas flow may be directed at the indentations 78, which accumulates gas to form the gas cushion. The indentations 78 may have straight or tapered sides. In one example, as illustrated in FIG. 10E, the indentations 78 have all straight sides such that the sides 76 and 77 are straight, e.g., perpendicular to the plane of the lower surface 74. In another example, as illustrated in FIG. 10F, the indentations 78 have all tapered sides such that the sides 76 are steeper or more abrupt than the sides 77 which have more of a gradual change of angle. The sides 77 within the indentations 78 may be tapered to compensate for a thermal gradient across the wafer carrier 70. Alternatively, the indentations 78 may have a combination of straight sides and tapered sides such that the sides 76 are straight and the sides 77 have a taper or the sides 77 are straight and the sides 76 have a taper.

The wafer carrier 70 contains a heat flux which extends from the lower surface 74 to the upper surface 72 and to any wafers disposed thereon. The heat flux may be controlled by both the internal pressure and length of the processing system. The profile of wafer carrier 70 may be tapered to compensate the heat loses from other sources. During a process, heat is lost through the edges of the wafer carrier 70, such as the short sides 71 and the long sides 73. However, the heat lost may be compensated by allowing more heat flux into the edges of the wafer carrier 70 by reducing the gap of the guide path in the levitation.

FIG. 10A also depicts the reactor body 120 disposed on the heating lamp assembly 150. The heating lamp assembly 150 may be configured to control the temperature profile within the CVD reactor by increasing and decreasing the temperature of the reactor body 120, the wafer carrier track 130, and specifically the wafer, along the length of the CVD reactor. The heating lamp assembly 150 may include a plurality of heating lamps disposed along the longitudinal length of the wafer carrier track 130. In one embodiment, the heating lamp assembly 150 includes individually controlled heating lamps disposed along the length of the wafer carrier track 130. In an alternative embodiment, the heating lamp assembly 150 includes a bank of heating lamps that are movable and follow a wafer as it travels along the wafer carrier track 130. The embodiments of the heating lamp assembly 150 may also be used as the heating lamp assembly 50, described above with respect to FIG. 1.

In an alternative embodiment, other types of heating assemblies (not shown) may be utilized to heat the reactor body 120 instead of the heating lamp assembly 150. In one embodiment, a heating assembly may include resistive heating elements, such as resistive heaters, which may be individually controlled along the length of the wafer carrier track 130. In one example, a resistive heating element may be bonded to or painted onto the reactor body 120, the wafer carrier track 130, or the wafer carrier 140. In alternative embodiment, another type of heating assembly that may be utilized to heat the reactor body 120 is an inductive heating element, such as with a radio frequency power source (not shown). The inductive heating element may be coupled to or with the reactor body 120, the wafer carrier track 130, and/or the wafer carrier 140. Embodiments of the various types of heating assemblies (including heating lamp assemblies 50 and 150) described herein may be utilized independently or in combination with the CVD reactor.

In one embodiment, the heating lamp assembly 150 may be configured to heat a wafer in the CVD reactor to a temperature within a range from about 300° C. to about 800° C. In one embodiment, the heating lamp assembly 150 may be configured to raise the temperature of the wafer to an appropriate process temperature prior to introduction into a deposition zone of the CVD reactor. In one embodiment, the heating lamp assembly 150 may be configured with the CVD reactor to bring the wafer to a temperature within a range from about 300° C. to about 800° C. prior to introduction into a deposition zone of the CVD reactor. In one embodiment, the wafer may be heated to within a process temperature range prior to entering one or more deposition zones of the CVD reactor to facilitate the deposition processes, and the temperature of the wafer may be maintained within the process temperature range as the wafer passes through the one or more deposition zones. The wafer may be heated to and maintained within the process temperature range as it moves along the wafer carrier track. A center temperature to an edge temperature of the wafer may be within 10° C. of each other.

In some embodiments, a method for forming a multi-layered material during a continuous CVD process is provide which includes continuously moving or advancing a plurality of wafers through a deposition system, wherein the deposition system contains a first deposition zone, a second deposition zone, a third deposition zone, and a fourth deposition zone. In some configurations, the system may have a fifth deposition zone, a sixth deposition zone, additional deposition zones, a heat-up zone, a cool-down zone, as well as other processing zones. The method further provides depositing a first material layer on a first wafer within the first deposition zone, moving or advancing the first wafer to the second deposition zone and moving or advancing a second wafer into the first deposition zone, and then depositing a second material layer on the first wafer within the second deposition zone, while depositing the first material layer on a second wafer within the first deposition zone. The second material layer is deposited on or over the first material layer for each wafer.

The method further provides moving or advancing the first wafer to the third deposition zone, moving or advancing the second wafer into the second deposition zone, and moving or advancing a third wafer into the first deposition zone, and then depositing a third material layer on the first wafer within the third deposition zone, while depositing the second material layer on the second wafer within the second deposition zone, and while depositing the first material layer on a third wafer within the first deposition zone.

The method further provides moving or advancing the first wafer to the fourth deposition zone, moving or advancing the second wafer to the third deposition zone, moving or advancing the third wafer into the second deposition zone, and moving or advancing a fourth wafer into the first deposition zone, and then depositing a fourth material layer on the first wafer within the fourth deposition zone, while depositing the third material layer on the second wafer within the third deposition zone, while depositing the second material layer on the third wafer within the second deposition zone, and while depositing the first material layer on a fourth wafer within the first deposition zone.

In some embodiments, the method further provides depositing a fifth material layer on the first wafer within a fifth deposition zone, while depositing the fourth material layer on the second wafer within the fourth deposition zone, while depositing the third material layer on the third wafer within the third deposition zone, while depositing the second material layer on the fourth wafer within the second deposition zone, and while depositing the first material layer on a fifth wafer within the first deposition zone. Examples are provided wherein the wafers or substrate generally advance or move horizontally in a forward direction, in the same direction, and at the same relative rate while advancing through the multiple deposition zones within the deposition system.

In some examples provide that the first material layer, the second material layer, the third material layer, and the fourth material layer have the same composition. In other examples, each of the first material layer, the second material layer, the third material layer, and the fourth material layer has a different composition. In many examples, each of the first material layer, the second material layer, the third material layer, and the fourth material layer contains arsenic, such as gallium arsenic, aluminum arsenic, aluminum gallium arsenic, alloys thereof, derivatives, or other materials.

The method further provides heating each of the wafers to a predetermined temperature within a heat-up zone prior to advancing into the first deposition zone. The predetermined temperature may be within a range from about 30° C. to about 850° C., preferably, from about 50° C. to about 750° C., and more preferably, from about 100° C. to about 350° C. In some embodiments, each of the wafers may be heated to the predetermined temperature for a duration within a range from about 2 minutes to about 6 minutes or from about 3 minutes to about 5 minutes. In other embodiments, each of the wafers may be heated to the predetermined temperature for a duration within a range from about 0.5 minutes to about 2 minutes or from about 1 minute to about 5 minutes or from about 5 minutes to about 15 minutes. The method also provides transferring each of the wafers into a cool-down zone subsequent to depositing the fourth material layer. Thereafter, the wafers may be cooled to a predetermined temperature while in the cool-down zone. The predetermined temperature may be within a range from about 18° C. to about 30° C. In some embodiments, each of the wafers may be cooled to the predetermined temperature for a duration within a range from about 2 minutes to about 6 minutes or from about 3 minutes to about 5 minutes. In other embodiments, each of the wafers may be cooled to the predetermined temperature for a duration within a range from about 0.5 minutes to about 2 minutes or from about 1 minute to about 5 minutes or from about 5 minutes to about 15 minutes.

In other embodiments, the wafers pass through a heat-up zone prior to entering the first deposition zone and the wafers pass through a cool-down zone subsequent to exiting the fourth deposition zone. The heat-up zone, the first deposition zone, the second deposition zone, the third deposition zone, and the fourth deposition zone, and the cool-down zone may all share a common linear path. The wafers may continuously and horizontally advance along the common linear path within the deposition system.

In one embodiment, a method for forming a multi-layered material during a continuous CVD process is provided which includes continuously advancing a plurality of wafers through a deposition system, wherein the deposition system has a first deposition zone, a second deposition zone, a third deposition zone, and a fourth deposition zone. The method further provides depositing a buffer layer on a first wafer within the first deposition zone, depositing a sacrificial layer on the first wafer within the second deposition zone, while depositing the buffer layer on a second wafer within the first deposition zone. The method further provides depositing a passivation layer on the first wafer within the third deposition zone, while depositing the sacrificial layer on the second wafer within the second deposition zone, and while depositing the buffer layer on a third wafer within the first deposition zone. The method further provides depositing a gallium arsenide active layer on the first wafer within the fourth deposition zone, while depositing the passivation layer on the second wafer within the third deposition zone, while depositing the sacrificial layer on the third wafer within the second deposition zone, and while depositing the buffer layer on a fourth wafer within the first deposition zone. In many examples, the wafers are gallium arsenide wafers.

In some embodiments, the method further provides depositing a gallium-containing layer on the first wafer within a fifth deposition zone, while depositing the gallium arsenide active layer on the second wafer within the fourth deposition zone, while depositing the passivation layer on the third wafer within the third deposition zone, while depositing the sacrificial layer on the fourth wafer within the second deposition zone, and while depositing the buffer layer on a fifth wafer within the first deposition zone. In some examples, the gallium-containing layer contains a phosphorous gallium arsenide.

In some embodiments, the method further provides heating each of the wafers to a predetermined temperature within a heat-up zone prior to the wafer advancing into the first deposition zone. The predetermined temperature may be within a range from about 30° C. to about 850° C., preferably, from about 50° C. to about 750° C., and more preferably, from about 100° C. to about 350° C. In other embodiments, the method further provides transferring each of the wafers into a cool-down zone subsequent to depositing the gallium arsenide active layer. Thereafter, each wafer is cooled to a predetermined temperature within a range from about 18° C. to about 30° C. while in the cool-down zone.

In other embodiments, the wafers pass through a heat-up zone prior to entering the first deposition zone and the wafers pass through a cool-down zone subsequent to exiting the fourth deposition zone. The heat-up zone, the first deposition zone, the second deposition zone, the third deposition zone, the fourth deposition zone, and the cool-down zone share a common linear path. Optionally, additional deposition zones, such as a fifth, sixth, seventh, or more, may also share the common linear path. The method provides the wafers continuously and horizontally advance along the common linear path within the deposition system.

In other embodiments, the method further provides flowing at least one gas between each of the deposition zones to form gas curtains therebetween. In some embodiments, the gas curtains or isolation curtains contain or are formed from at least one gas, such as hydrogen, arsine, a mixture of hydrogen and arsine, nitrogen, argon, or combinations thereof. In many examples, a mixture of hydrogen and arsine is utilized to form the gas curtains or isolation curtains.

In another embodiment, a method for forming a multi-layered material during a continuous CVD process is provided which includes continuously advancing a plurality of wafers through a deposition system, wherein the deposition system has a heat-up zone, a first deposition zone, a second deposition zone, a third deposition zone, a fourth deposition zone, and a cool-down zone. The method further provides depositing a gallium arsenide buffer layer on a first wafer within the first deposition zone, then depositing an aluminum arsenide sacrificial layer on the first wafer within the second deposition zone, while depositing the gallium arsenide buffer layer on a second wafer within the first deposition zone. The method further provides depositing an aluminum gallium arsenide passivation layer on the first wafer within the third deposition zone, while depositing the aluminum arsenide sacrificial layer on the second wafer within the second deposition zone, and while depositing the gallium arsenide buffer layer on a third wafer within the first deposition zone. The method further provides depositing a gallium arsenide active layer on the first wafer within the fourth deposition zone, while depositing the aluminum gallium arsenide passivation layer on the second wafer within the third deposition zone, while depositing the aluminum arsenide sacrificial layer on the third wafer within the second deposition zone, and while depositing the gallium arsenide buffer layer on a fourth wafer within the first deposition zone.

Figure 11:
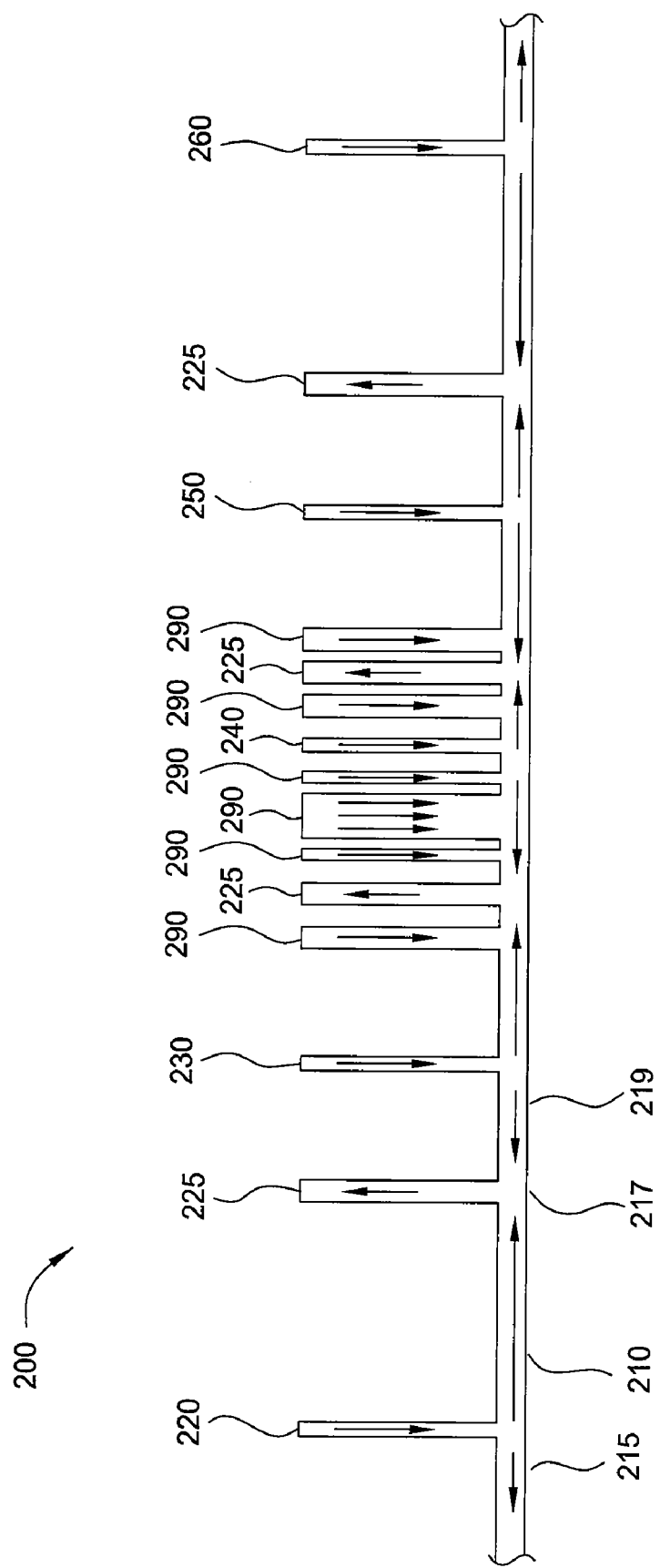
FIG. 11 depicts a first layout of the CVD reactor according to one embodiment described herein.

FIGS. 11-17 illustrate various configurations of CVD processes that can be utilized with the CVD reactor as described herein. FIG. 11 illustrates a first configuration 200, having an entrance isolator assembly 220, a first isolator assembly 230, a second isolator assembly 240, a third isolator assembly 250, and an exit isolator assembly 260. A plurality of deposition zones 290 may be located along the wafer carrier track of the CVD reactor and may be surrounded by the isolator assemblies. Between each of these isolator assemblies, one or more exhausts 225 may be provided to remove any gases that are supplied to the wafer at each isolator assembly or deposition zone. As shown, a precursor gas may be injected at the entrance isolator assembly 220, which follows a two dimensional flow path, e.g., down to the wafer and then along the length of the wafer carrier track, indicated by flow path 210 for example. The gas is then exhausted up through exhaust 225, which may be provided on each side of the isolator assembly 220. The gas may be directed at the entrance isolator assembly 220 and then along the length of the wafer carrier track, indicated by flow path 215 for example, to prevent contaminants from entering the entrance of the CVD reactor. Gas injected at the intermediate isolator assemblies, such as isolator assembly 230, or at the deposition zones 290, may travel upstream from the flow of the wafer, indicated by flow path 219 for example. This back diffusion of gas may be received through the adjacent exhaust to prevent contaminants or mixing of gases between zones along the wafer carrier track of the CVD reactor. In addition, the flow rate of the gases injected through the isolator assemblies, e.g., along flow path 210, in the direction of the wafer flow may also be adapted to further prevent back diffusion from entering the isolation zone. The laminar flow along flow path 210 may be flowed at different flow rates to meet any back diffusion of gas, for example at junction 217 below exhaust 225, to prevent the back diffusion of gas from isolator assembly 230 from entering the isolation zone developed by isolator assembly 220. In one embodiment, the wafer may be heated to within a process temperature range as it travels along the wafer carrier track prior to entering the deposition zones 290. The temperature of the wafer may be maintained within the process temperature range as it travels along the wafer carrier track through the deposition zones 290. The wafer may be cooled to within a specific temperature range upon exiting the deposition zones 290 as it travels along the remainder of the wafer carrier track.

The lengths of the isolation zones and the deposition zones may be varied to reduce the effects of back diffusion of gases. In one embodiment, the lengths of the isolation zones created may range from about 1 meter to about 2 meters in length but may extend beyond this range for different applications.

The flow rates of the gases injected from the isolator assemblies may also be varied to reduce the effects of back diffusion of gases. In one embodiment, the entrance isolator assembly 220 and the exit isolator assembly 260 may supply a precursor gas at about 30 liters per minute, while the first 230, second 240, and third 250 isolator assemblies may supply a precursor gas at about 3 liters per minute. In one embodiment, the precursor gas supplied at the entrance isolator assembly 220 and the exit isolator assembly 260 may include nitrogen. In one embodiment, the precursor gas supplied at the first 230, second 240, and third 250 isolator assemblies may include arsine. In one embodiment, two isolator assemblies may supply a total of about 6 liters per minute of nitrogen. In one embodiment, three isolator assemblies may supply a total of about 9 liters per minute of arsine.

The gap, e.g., the thickness between the guide path of the wafer carrier track and the raised portion of the reactor lid assembly, alternatively, the thickness of the space through which wafer travels into and out of the CVD reactor, of the isolation zones may also be varied to reduce the effects of back diffusion of gases. In one embodiment, the isolator gap may be in a range of about 0.1 mm to about 5 mm.

Figure 18:
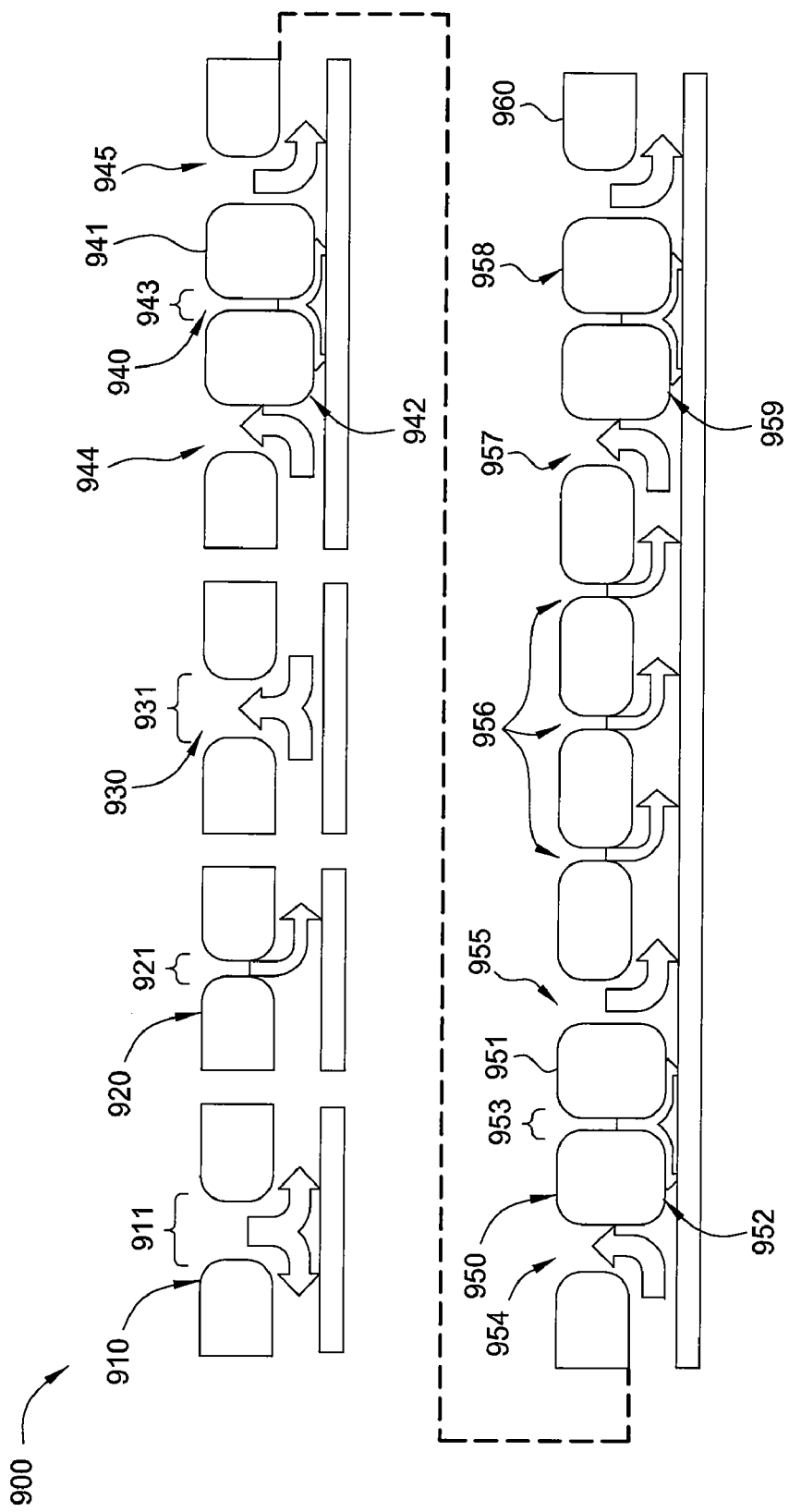
FIG. 18 depicts flow path configurations of the CVD reactor according to one embodiment described herein.

FIG. 18 illustrates several flow path configurations 900 which may be provided by the CVD reactor. The flow path configurations 900 may be used for injecting a gas through one or more isolator assemblies, injecting a gas into a deposition zone, and/or exhausting a gas from isolation and/or deposition zones. Dual flow path configuration 910 shows a gas directed in the same direction as the flow path of the wafer, as well as in the opposite direction of the flow path of the wafer. In addition, a larger volume of flow may be directed through the dual flow path configuration 910 due to the wider flow area 911. This wider flow area 911 may be adapted for use with the other embodiments described herein. Single flow path configuration 920 shows a gas directed in a single direction, which may be in the same or opposite direction of the flow path of the wafer. In addition, a low volume of flow may be directed through the single flow path configuration 920 due to the narrow flow area 921. This narrower flow area 921 may be adapted for use with the other embodiments described herein. Exhaust flow path configuration 930 shows that gas may be exhausted from adjacent zones through a wider flow area 931, such as adjacent isolation zones, adjacent deposition zones, or an isolation zone adjacent to a deposition zone.

In one embodiment, first exhaust/injector flow path configuration 940 shows a dual flow path configuration 941 having a narrow flow area 943 disposed between an exhaust flow path 944 and a single injection flow path 945. Also shown is a narrower gap 942 portion along which the wafer may travel through the CVD reactor. As described above, the gap 942 may vary along the wafer carrier track of the CVD reactor, thereby allowing a gas to be directly and uniformly injected onto the surface of the wafer. This narrower gap 942 portion may be used to provide full consumption or near full consumption of the gas injected onto the wafer during a reaction in a deposition zone. In addition, the gap 942 may be used to facilitate thermal control during the isolation and/or deposition process. A gas injected in the narrower gap 942 portion may maintain a higher temperature as it is injected onto the wafer.

In one embodiment, a second exhaust/injector flow path configuration 950 provides a first exhaust flow path 954 having a wide flow area, a first dual flow path configuration 951 having a narrow gap portion 952 and flow area 953, a first single injection flow path 955 having a wide flow area, a plurality of single injection flow paths 956 having narrow flow areas a wide gap portion, a second exhaust flow path 957 having a wide flow area, a second dual flow path configuration 958 having a narrow gap portion 959 and flow area, and a second single injection flow path 960 having a wide flow area and gap portion.

In one embodiment, the gas injected through the isolator assemblies may be directed in the same direction as the flow path of the wafer. In an alternative embodiment, the gas injected through the isolator assemblies may be directed in the opposite direction as the flow path of the wafer. In an alternative embodiment, the gas injected through the isolator assemblies may be directed in both the same and opposite direction as the flow path of the wafer. In an alternative embodiment, the isolator assemblies may direct gas in different directions depending on their location in the CVD reactor.

In one embodiment, the gas injected into the deposition zones may be directed in the same direction as the flow path of the wafer. In an alternative embodiment, the gas injected into the deposition zones may be directed in the opposite direction as the flow path of the wafer. In an alternative embodiment, the gas injected into the deposition zones may be directed in both the same and opposite direction as the flow path of the wafer. In an alternative embodiment, gas may be directed in different directions depending on the location of the deposition zone in the CVD reactor.

Figure 12:
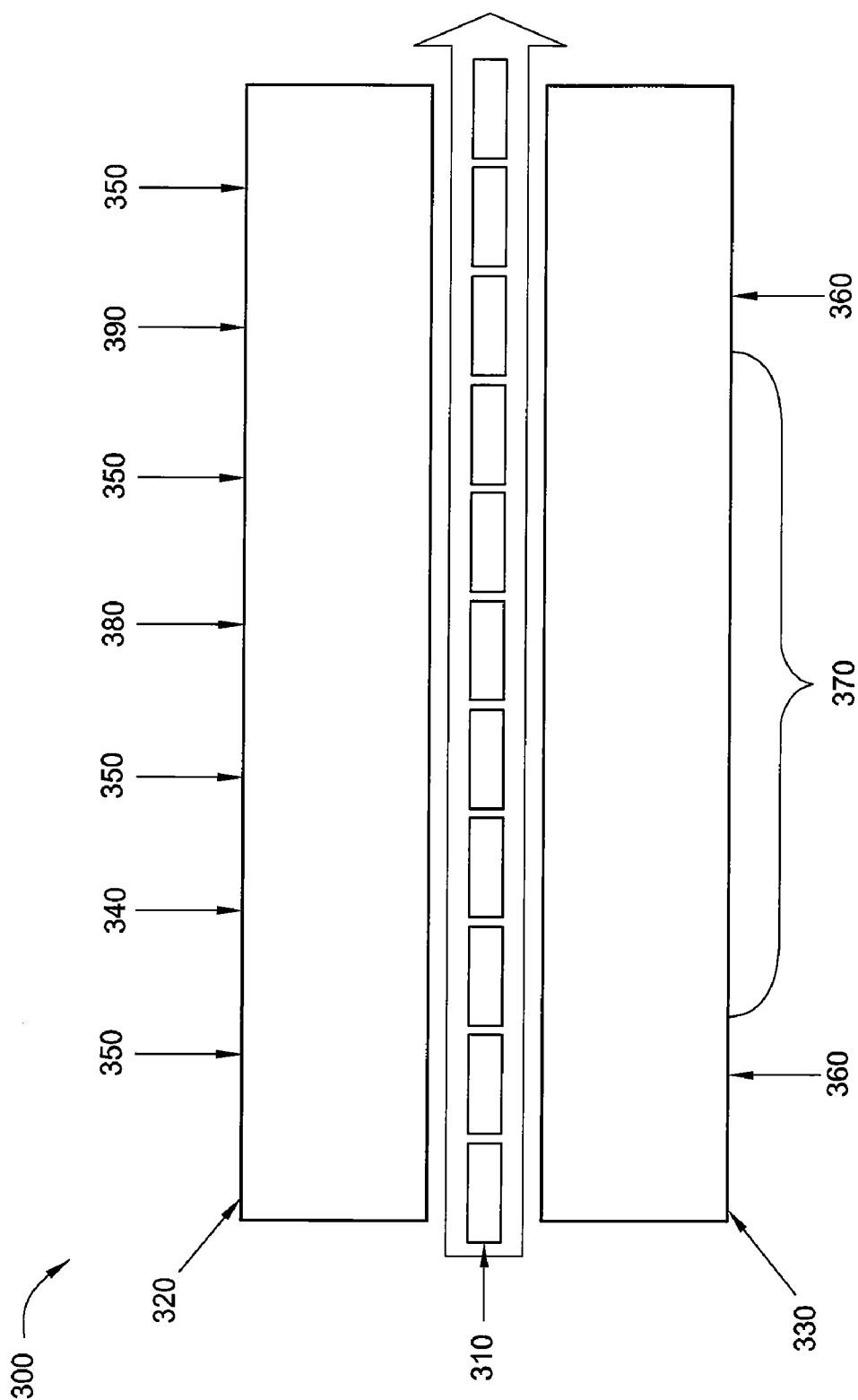
FIG. 12 depicts a second layout of the CVD reactor according to one embodiment described herein.

FIG. 12 illustrates a second configuration 300. The wafer(s) 310 is introduced into the entrance of the CVD reactor and travels along the wafer carrier track of the reactor. The reactor lid assembly 320 provides several gas isolation curtains 350 located at the entrance and the exit of the CVD reactor, as well as between deposition zones 340, 380, 390 to prevent contamination and mixing of the gases between deposition and isolation zones. The gas isolation curtains and deposition zones may be provided by one or more gas manifold assemblies of the reactor lid assembly 320. These deposition zones include an aluminum arsenide deposition zone 340, a gallium arsenide deposition zone 380, and a phosphorous gallium arsenide deposition zone 390, thereby forming a multiple layer epitaxial deposition process and structure. As the wafer(s) 310 travels along the bottom portion 330 of the reactor, which may generally include the wafer carrier track and the heating lamp assembly, the wafer 310 may be subjected to temperature ramps 360 at the entrance and exit of the reactor to incrementally increase and decrease the temperature of the wafer, prior to entering and upon exiting the deposition zones 340, 380, 390, to reduce thermal stress imparted on the wafer 310. The wafer 310 may be heated to within a process temperature range prior to entering the deposition zones 340, 380, 390 to facilitate the deposition processes. As the wafer 310 travels through the deposition zones 340, 380, 390 the temperature of the wafer may be maintained within a thermal region 370 to assist with the deposition processes. The wafer(s) 310 may be provided on a conveyorized system to continuously feed and receive wafers into and out of the CVD reactor.

Figure 13:
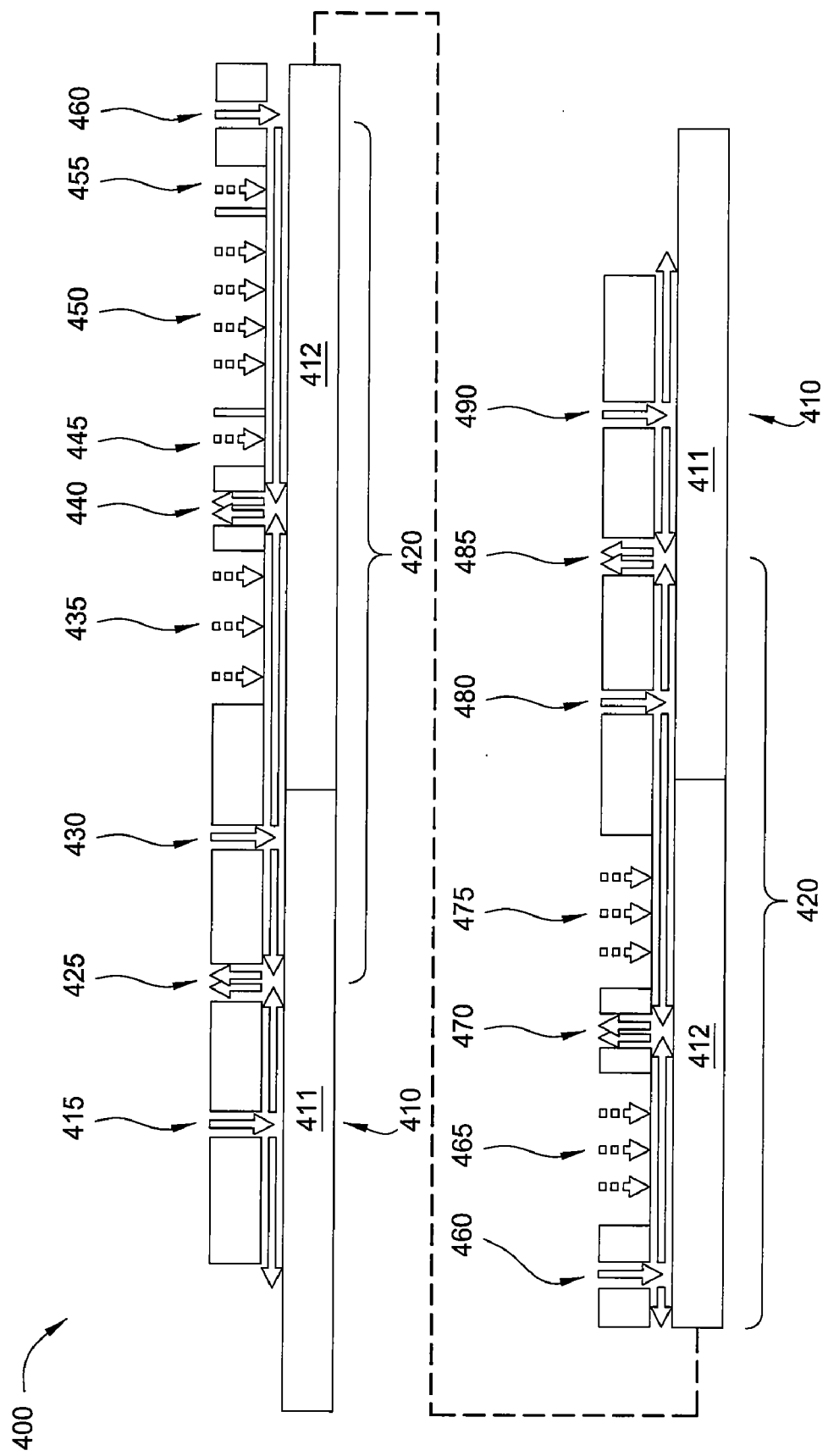
FIG. 13 depicts a third layout of the CVD reactor according to one embodiment described herein.

FIG. 13 illustrates a third configuration 400. The CVD reactor may be configured to supply nitrogen 410 to the reactor to float the wafer(s) along the wafer carrier track of the reactor at the entrance and the exit. A hydrogen/arsine mixture 420 may also be used to float the wafer along the wafer carrier track of the CVD reactor between the exit and entrance. The stages of the third configuration 400 may be provided by one or more gas manifold assemblies of the reactor lid assembly. The stages along the wafer carrier track may include an entrance nitrogen isolation zone 415, a preheat exhaust zone 425, a hydrogen/arsine mixture preheat isolation zone 430, a gallium arsenide deposition zone 435, a gallium arsenide exhaust 440, an aluminum gallium arsenide deposition zone 445, a gallium arsenide N-layer deposition zone 450, a gallium arsenide P-layer deposition zone 455, a phosphorous hydrogen arsine isolation zone 460, a first phosphorous aluminum gallium arsenide deposition zone 465, a phosphorous aluminum gallium arsenide exhaust zone 470, a second phosphorous aluminum gallium arsenide deposition zone 475, a hydrogen/arsine mixture cool down isolation zone 480, a cool down exhaust zone 485, and an exit nitrogen isolation zone 490. As the wafer travels along the bottom portion of the reactor, which may generally include the wafer carrier track and the heating lamp assembly, the wafer may be subjected to one or more temperature ramps 411 at the entrance and exit of the reactor to incrementally increase and decrease the temperature of the wafer, prior to entering and upon exiting the deposition zones 435, 445, 450, 455, 465, 475 to reduce thermal stress imparted on the wafer. The wafer may be heated to within a process temperature range prior to entering the deposition zones 435, 445, 450, 455, 465, 475 to facilitate the deposition processes. As the wafer travels through the deposition zones 435, 445, 450, 455, 465, 475 the temperature of the wafer may be maintained within a thermal region 412 to assist with the deposition processes. As shown, the temperature of the wafer traveling through the third configuration 400 may be increased as it passes the entrance isolation zone 415, may be maintained as is travels through the zones 430, 435, 440, 445, 450, 455, 460, 465, 470, 475, and may be decreased as it nears the hydrogen/arsine mixture cool down isolation zone 480 and travels along the remainder of the wafer carrier track.

Figure 14:
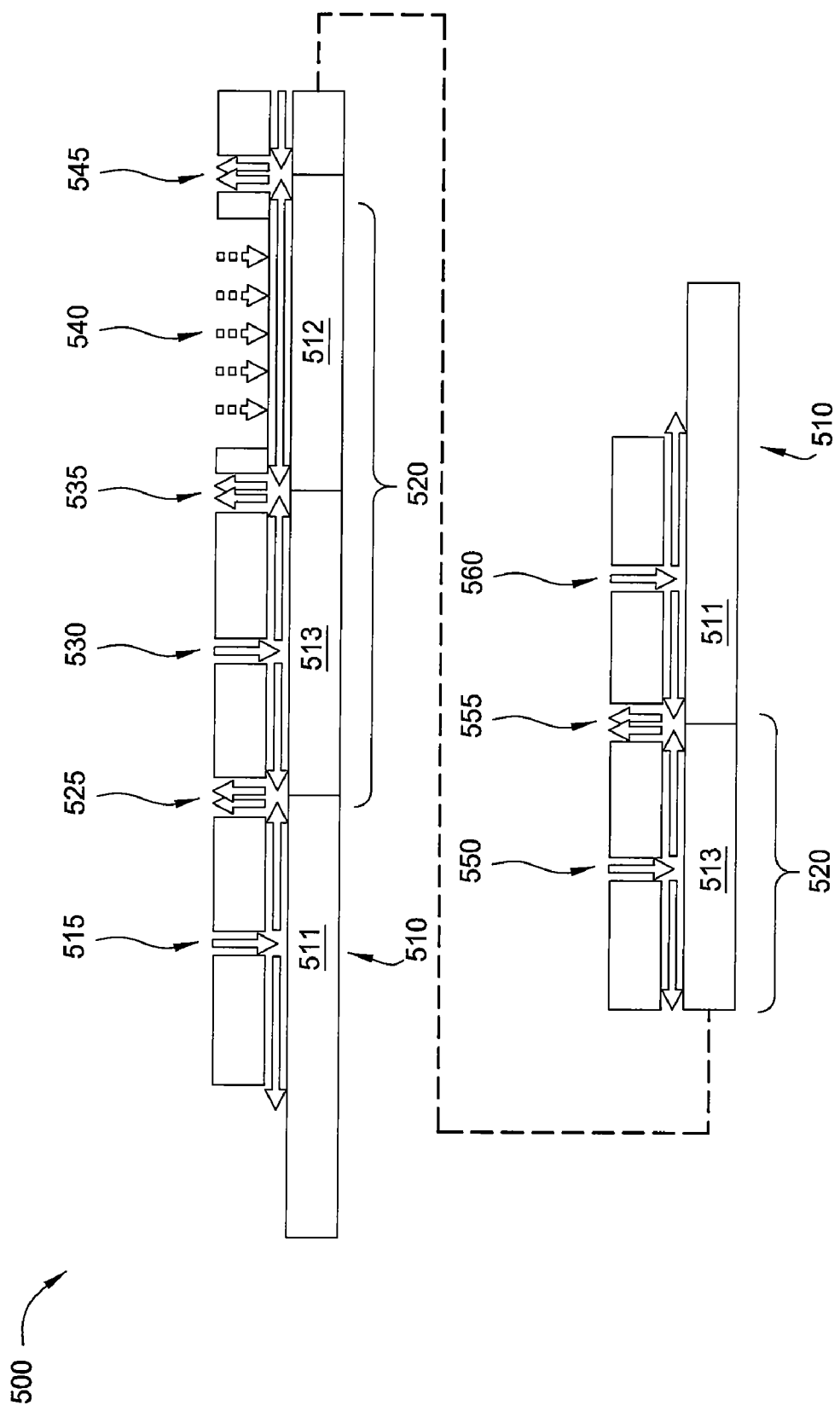
FIG. 14 depicts a fourth layout of the CVD reactor according to one embodiment described herein.

FIG. 14 illustrates a fourth configuration 500. The CVD reactor may be configured to supply nitrogen 510 to the reactor to float the wafer(s) along the wafer carrier track of the reactor at the entrance and the exit. A hydrogen/arsine mixture 520 may also be used to float the wafer along the wafer carrier track of the CVD reactor between the exit and entrance. The stages of the fourth configuration 500 may be provided by one or more gas manifold assemblies of the reactor lid assembly. The stages along the wafer carrier track may include an entrance nitrogen isolation zone 515, a pre-heat exhaust zone 525, a hydrogen/arsine mixture preheat isolation zone 530, an exhaust zone 535, a deposition zone 540, an exhaust zone 545, a hydrogen/arsine mixture cool down isolation zone 550, a cool down exhaust zone 555, and an exit nitrogen isolation zone 545. In one embodiment, the deposition zone 540 may include an oscillating showerhead assembly. As the wafer travels along the bottom portion of the reactor, which may generally include the wafer carrier track and the heating lamp assembly, the wafer may be subjected to one or more temperature ramps 511, 513 at the entrance and exit of the reactor to incrementally increase and decrease the temperature of the wafer, prior to entering and upon exiting the deposition zone 540 to reduce thermal stress imparted on the wafer. The wafer may be heated to within a process temperature range prior to entering the deposition zone 540 to facilitate the deposition process. In one embodiment, the wafer may be heated and/or cooled to within a first temperature range as it travels through the temperature ramps 511. In one embodiment, the wafer may be heated and/or cooled to within a second temperature range as it travels through the temperature ramps 513. The first temperature range may be greater than, less than, and/or equal to the second temperature range. As the wafer travels through the deposition zone 540 the temperature of the wafer may be maintained within a thermal region 512 to assist with the deposition processes. As shown, the temperature of the wafer traveling through the fourth configuration 500 may be increased as it passes the entrance isolation zone 515, may be maintained as is travels through the deposition zone 540, and may be decreased as it nears the hydrogen/arsine mixture cool down isolation zone 550 and travels along the remainder of the wafer carrier track.

Figure 15:
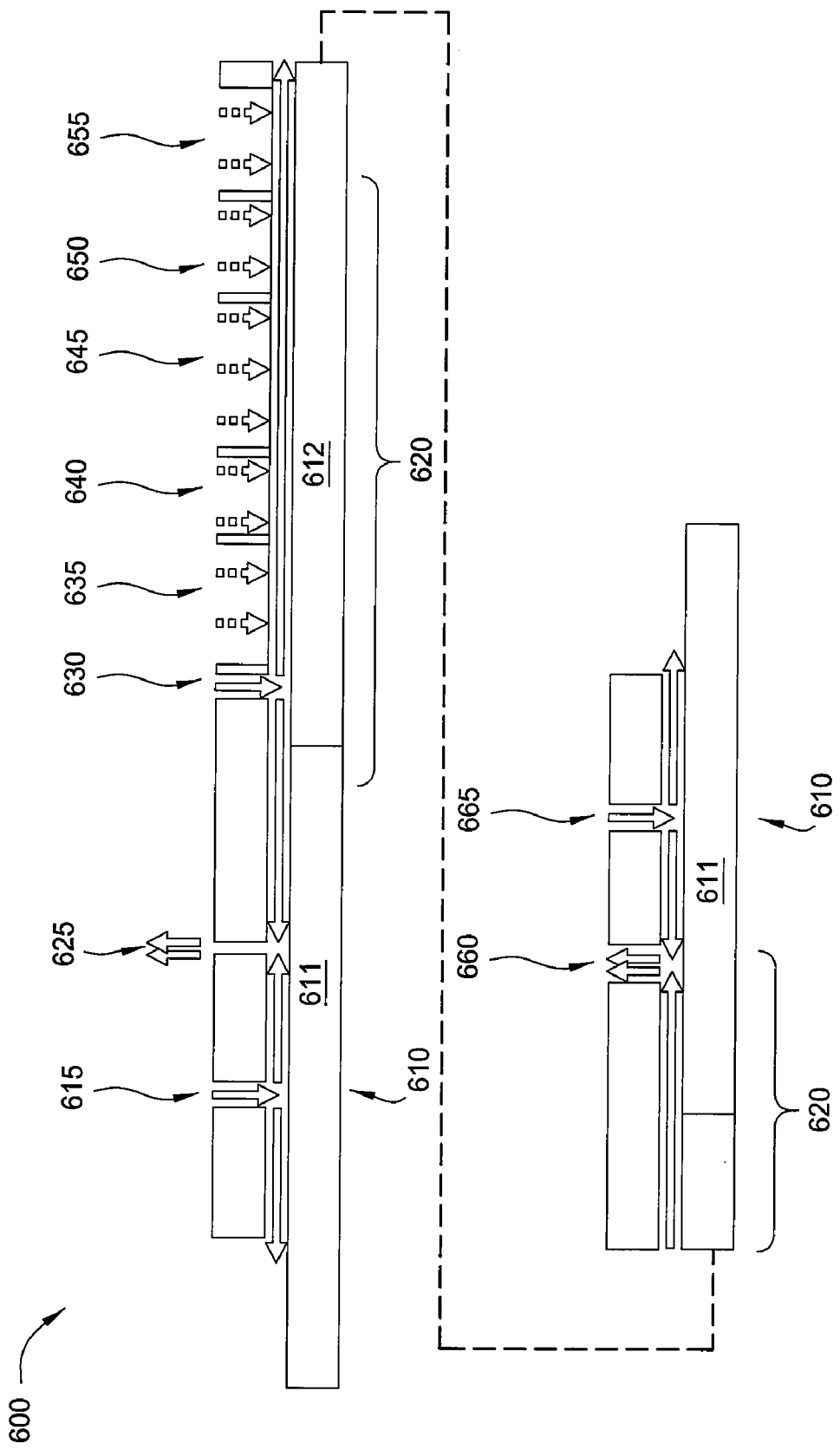
FIG. 15 depicts a fifth layout of the CVD reactor according to one embodiment described herein.

FIG. 15 illustrates a fifth configuration 600. The CVD reactor may be configured to supply nitrogen 610 to the reactor to float the wafer(s) along the wafer carrier track of the reactor at the entrance and the exit. A hydrogen/arsine mixture 620 may also be used to float the wafer along the wafer carrier track of the CVD reactor between the exit and entrance. The stages of the fifth configuration 600 may be provided by one or more gas manifold assemblies of the reactor lid assembly. The stages along the wafer carrier track may include an entrance nitrogen isolation zone 615, a pre-heat exhaust with flow balance restrictor zone 625, an active hydrogen/arsine mixture isolation zone 630, a gallium arsenide deposition zone 635, an aluminum gallium arsenide deposition zone 640, a gallium arsenide N-layer deposition zone 645, a gallium arsenide P-layer deposition zone 650, a phosphorous aluminum gallium arsenide deposition zone 655, a cool down exhaust zone 660, and an exit nitrogen isolation zone 665. As the wafer travels along the bottom portion of the reactor, which may generally include the wafer carrier track and the heating lamp assembly, the wafer may be subjected to one or more temperature ramps 611 at the entrance and exit of the reactor to incrementally increase and decrease the temperature of the wafer, prior to entering and upon exiting the deposition zones 635, 640, 645, 650, 655 to reduce thermal stress imparted on the wafer. The wafer may be heated to within a process temperature range prior to entering the deposition zones 635, 640, 645, 650, 655 to facilitate the deposition processes. As the wafer travels through the deposition zones 635, 640, 645, 650, 655 the temperature of the wafer may be maintained within a thermal region 612 to assist with the deposition processes. As shown, the temperature of the wafer traveling through the fifth configuration 600 may be increased as is passes the entrance isolation zone 615 and approaches the active hydrogen/arsine mixture isolation zone 630, may be maintained as it travels through the deposition zones 635, 640, 645, 650, 655, and may be decreased as it nears the cool down exhaust zone 660 and travels along the remainder of the wafer carrier track.

Figure 16:
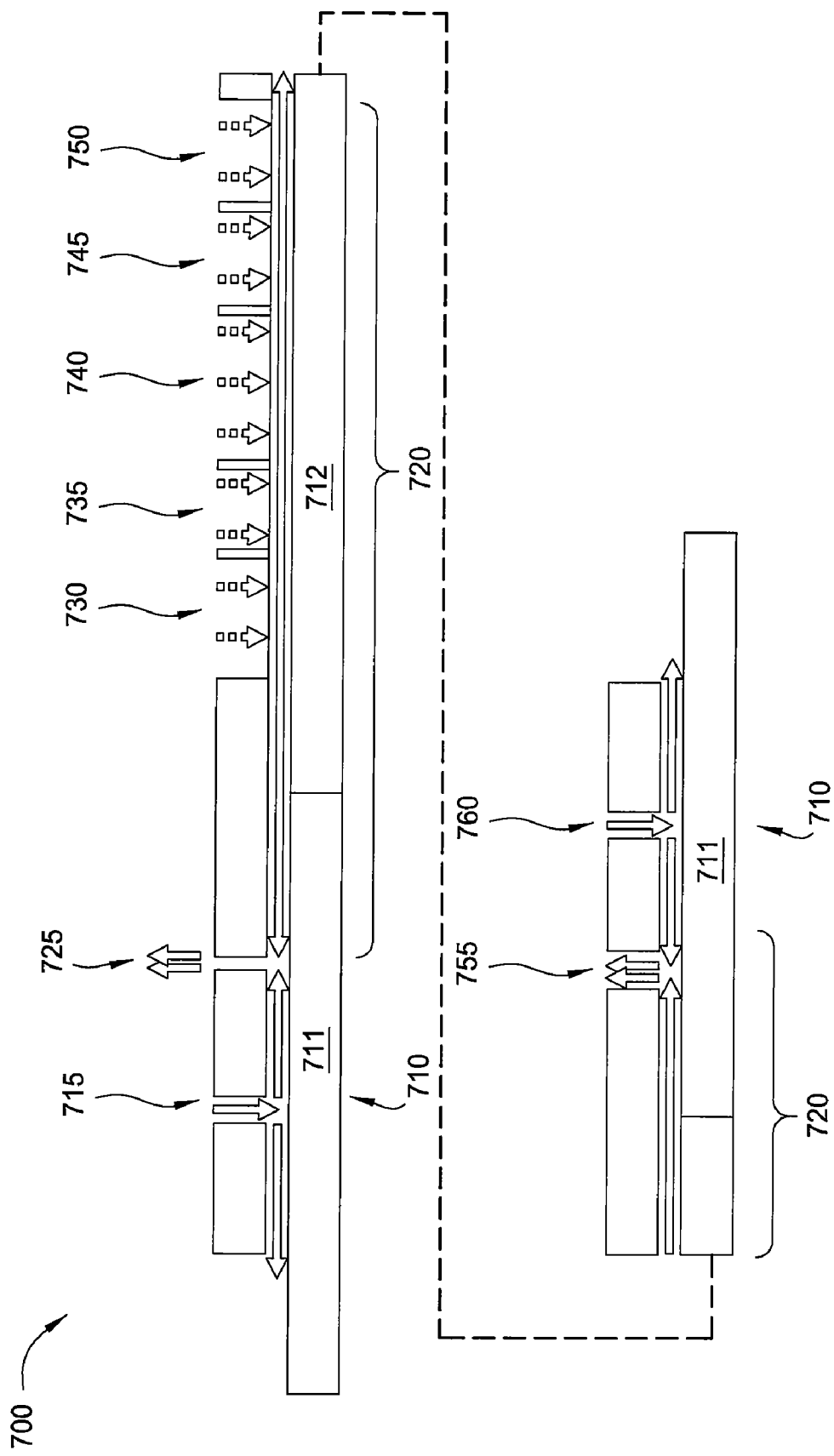
FIG. 16 depicts a sixth layout of the CVD reactor according to one embodiment described herein.

FIG. 16 illustrates a sixth configuration 700. The CVD reactor may be configured to supply nitrogen 710 to the reactor to float the wafer(s) along the wafer carrier track of the reactor at the entrance and the exit. A hydrogen/arsine mixture 720 may also be used to float the wafer along the wafer carrier track of the CVD reactor between the exit and entrance. The stages of the sixth configuration 700 may be provided by one or more gas manifold assemblies of the reactor lid assembly. The stages along the wafer carrier track may include an entrance nitrogen isolation zone 715, a pre-heat exhaust with flow balance restrictor zone 725, a gallium arsenide deposition zone 730, an aluminum gallium arsenide deposition zone 735, a gallium arsenide N-layer deposition zone 740, a gallium arsenide P-layer deposition zone 745, a phosphorous aluminum gallium arsenide deposition zone 750, a cool down exhaust with flow balance restrictor zone 755, and an exit nitrogen isolation zone 760. As the wafer travels along the bottom portion of the reactor, which may generally include the wafer carrier track and the heating lamp assembly, the wafer may be subjected to one or more temperature ramps 711 at the entrance and exit of the reactor to incrementally increase and decrease the temperature of the wafer, prior to entering and upon exiting the deposition zones 730, 735, 740, 745, 750 to reduce thermal stress imparted on the wafer. The wafer may be heated to within a process temperature range prior to entering the deposition zones 730, 735, 740, 745, 750 to facilitate the deposition processes. As the wafer travels through the deposition zones 730, 735, 740, 745, 750 the temperature of the wafer may be maintained within a thermal region 712 to assist with the deposition processes. As shown, the temperature of the wafer traveling through the sixth configuration 700 may be increased as is passes the entrance isolation zone 715 and approaches the gallium arsenide deposition zone 730, may be maintained as it travels through the deposition zones 730, 735, 740, 745, 750, and may be decreased as it nears the cool down exhaust zone 755 and travels along the remainder of the wafer carrier track.

Figure 17:
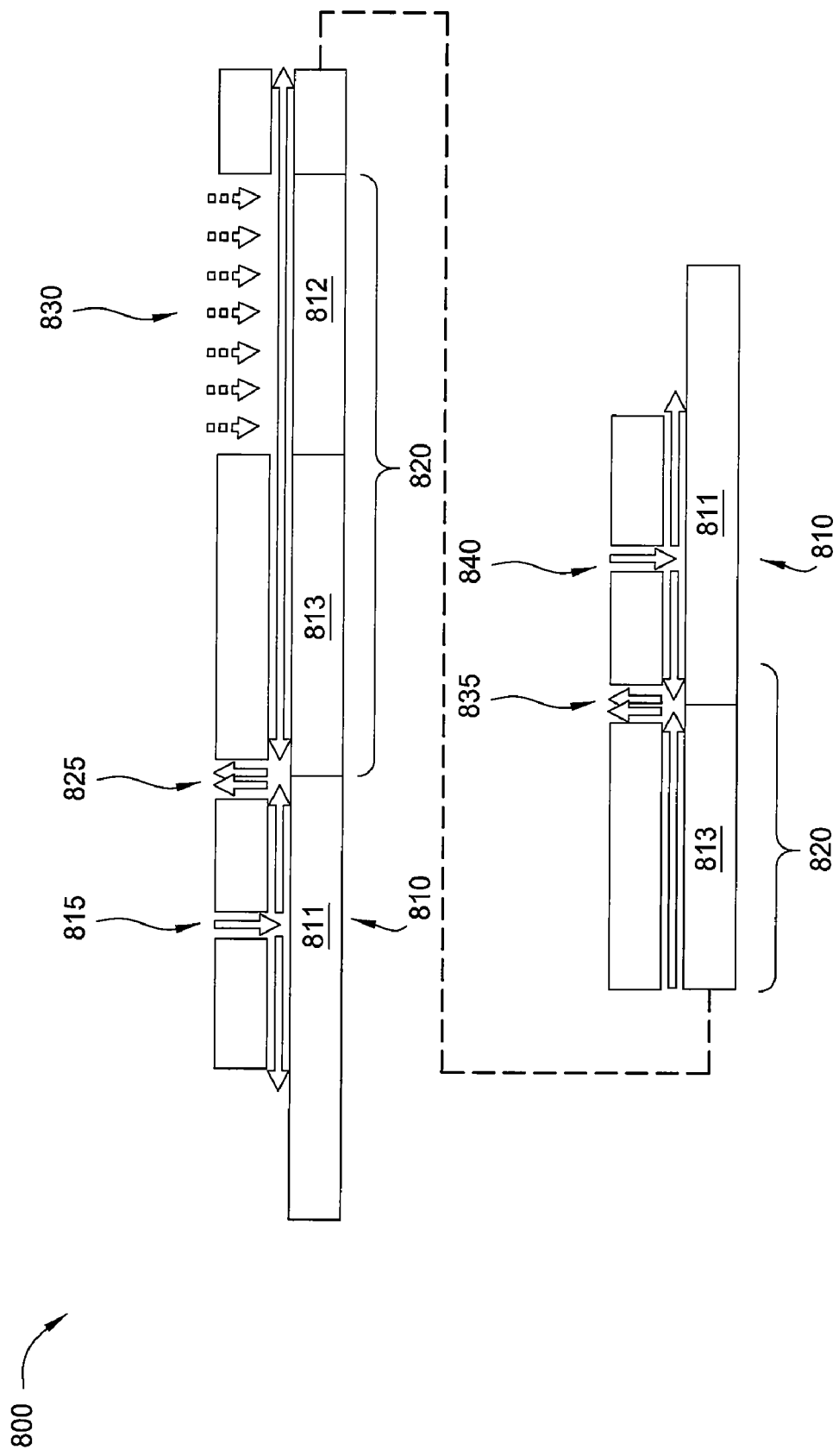
FIG. 17 depicts a seventh layout of the CVD reactor according to one embodiment described herein.

FIG. 17 illustrates a seventh configuration 800. The CVD reactor may be configured to supply nitrogen 810 to the reactor to float the wafer(s) along the wafer carrier track of the reactor at the entrance and the exit. A hydrogen/arsine mixture 820 may also be used to float the wafer along the wafer carrier track of the CVD reactor between the exit and entrance. The stages of the seventh configuration 800 may be provided by one or more gas manifold assemblies of the reactor lid assembly. The stages along the wafer carrier track may include an entrance nitrogen isolation zone 815, a pre-heat exhaust zone 825, a deposition zone 830, a cool down exhaust zone 835, and an exit nitrogen isolation zone 840. In one embodiment, the deposition zone 830 may include an oscillating showerhead assembly. As the wafer travels along the bottom portion of the reactor, which may generally include the wafer carrier track and the heating lamp assembly, the wafer may be subjected to one or more temperature ramps 811, 813 at the entrance and exit of the reactor to incrementally increase and decrease the temperature of the wafer, prior to entering and upon exiting the deposition zone 830 to reduce thermal stress imparted on the wafer. The wafer may be heated to within a process temperature range prior to entering the deposition zone 830 to facilitate the deposition process. In one embodiment, the wafer may be heated and/or cooled to within a first temperature range as it travels through the temperature ramps 811. In one embodiment, the wafer may be heated and/or cooled to within a second temperature range as it travels through the temperature ramps 813. The first temperature range may be greater than, less than, and/or equal to the second temperature range. As the wafer travels through the deposition zone 830 the temperature of the wafer may be maintained within a thermal region 812 to assist with the deposition processes. As shown, the temperature of the wafer traveling through the seventh configuration 800 may be increased as it passes the entrance isolation zone 815 and approaches the deposition zone 830, may be maintained as it travels through the deposition zone 830, and may be decreased as it nears the cool down exhaust zone 835, then the exit nitrogen isolation zone 840 and travels along the remainder of the wafer carrier track.

In one embodiment, the CVD reactor may be configured to grow or deposit a high quality gallium arsenide and aluminum gallium arsenide double heterostructure at a deposition rate of about 1 μm/min, may be configured to grow or deposit a high quality aluminum arsenide epitaxial lateral overgrowth sacrificial layer, and may be configured to provide a throughput of about 6 wafers per minute to about 10 wafers per minute.

In some embodiments, the CVD reactor may be configured to grow or deposit materials on wafers of varying sizes, for example, 4 cm×4 cm or 10 cm×10 cm. In one embodiment the CVD reactor may be configured to provide a 300 nm gallium arsenide buffer layer. In another embodiment the CVD reactor may be configured to provide a 30 nm aluminum gallium arsenide passivation layer. In another embodiment the CVD reactor may be configured to provide a 1,000 nm gallium arsenide active layer. In another embodiment the CVD reactor may be configured to provide a 30 nm aluminum gallium arsenide passivation layer. In another embodiment the CVD reactor may be configured to provide a dislocation density of less than $1\times10^4$ per $cm^2$, a photoluminescence efficiency of 99%, and a photoluminescence lifetime of 250 nanoseconds.

In another embodiment the CVD reactor may be configured to provide an epitaxial lateral overgrowth layer having a 5 nm deposition ±0.5 nm, an etch selectivity greater than $1\times10^6$, zero pinholes, and an aluminum arsenide etch rate greater than 0.2 mm per hour. In another embodiment the CVD reactor may be configured to provide a center to edge temperature non-uniformity of no greater than 10° C. for temperatures above 300° C., a V-III ratio of no more than 5, and a maximum temperature of 800° C.

In one embodiment the CVD reactor may be configured to provide a deposition layers having a 300 nm gallium arsenide buffer layer, a 5 nm aluminum arsenide sacrificial layer, a 10 nm aluminum gallium arsenide window layer, a 700 nm gallium arsenide $2\times10^{17}$ Si active layer, a 300 nm aluminum gallium arsenide $1\times10^{19}$ C P+ layer, and a 300 nm gallium arsenide $1\times10^{19}$ C P+ layer.

In another embodiment the CVD reactor may be configured to provide a deposition layers having a 300 nm gallium arsenide buffer layer, a 5 nm aluminum arsenide sacrificial layer, a 10 nm gallium indium phosphide window layer, a 700 nm gallium arsenide $2\times10^{17}$ Si active layer, a 100 nm gallium arsenide C P layer, a 300 nm gallium indium phosphide P window layer, a 20 nm gallium indium phosphide $1\times10^{20}$ P+ tunnel junction layer, a 20 nm gallium indium phosphide $1\times10^{20}$ N+ tunnel junction layer, a 30 nm aluminum gallium arsenide window, a 400 nm gallium indium phosphide N active layer, a 100 nm gallium indium phosphide P active layer, a 30 nm aluminum gallium arsenide P window, and a 300 nm gallium arsenide P+ contact layer.

Embodiments of the invention generally relate to a levitating substrate carrier or support. In one embodiment, a substrate carrier for supporting and carrying at least one substrate or wafer passing through a reactor is provided which includes a substrate carrier body containing an upper surface and a lower surface, and at least one indentation pocket disposed within the lower surface. In another embodiment, the substrate carrier includes a substrate carrier body containing an upper surface and a lower surface, and at least two indentation pockets disposed within the lower surface. In another embodiment, the substrate carrier includes a substrate carrier body containing an upper surface and a lower surface, an indentation area within the upper surface, and at least two indentation pockets disposed within the lower surface. In another embodiment, the substrate carrier includes a substrate carrier body containing an upper surface and a lower surface, an indentation area within the upper surface, and at least two indentation pockets disposed within the lower surface, wherein each indentation pocket has a rectangular geometry and four side walls which extend perpendicular or substantially perpendicular to the lower surface. In another embodiment, the substrate carrier includes a substrate carrier body containing an upper surface and a lower surface, and at least two indentation pockets disposed within the lower surface, wherein each indentation pocket has a rectangular geometry and four side walls which extend perpendicular or substantially perpendicular to the lower surface.

In another embodiment, a substrate carrier for supporting and carrying at least one substrate passing through a reactor is provided which includes a substrate carrier body containing an upper surface and a lower surface, and at least one indentation pocket disposed within the lower surface. The substrate carrier body may have a rectangular geometry, a square geometry, or another type of geometry. In one example, the substrate carrier body has two short sides and two long sides, wherein one of the two short sides is the front of the substrate carrier body and the other short side is the rear of the substrate carrier body. The substrate carrier body may contain or be made from graphite.

In some examples, the upper surface contains at least one indentation area disposed therein. The indentation area within the upper surface is configured to hold a substrate thereon. In other examples, the upper surface may have at least two, three, four, eight, twelve, or more of the indentation areas. In another example, the upper surface has no indentation areas.

In another embodiment, the lower surface may have at least two of the indentation pockets, which are configured to accept a gas cushion. In some examples, the lower surface has one, three, or more of the indentation pockets. The indentation pocket may have a rectangular geometry, a square geometry, or another type of geometry. Each of the indentation pockets usually has two short sides and two long sides. In one example, the short sides and the long sides are straight. The short sides and the long sides are perpendicular relative to the lower surface. In another example, at least one of the two short sides is tapered at a first angle, at least one of the two long sides is tapered at a second angle, and the first angle may be greater than or less than the second angle. In another example, at least one of the two short sides is straight and at least one of the two long sides is tapered. In another example, at least one of the two short sides is tapered and at least one of the two long sides is straight. In one embodiment, the indentation pocket has a rectangular geometry and the indentation pocket is configured to accept a gas cushion. The indentation pocket may have tapered side walls which taper away from the upper surface.

In another embodiment, a method for levitating substrates disposed on an upper surface of a substrate carrier during a vapor deposition process is provided which includes exposing a lower surface of a substrate carrier to a gas stream, forming a gas cushion under the substrate carrier, levitating the substrate carrier within a processing chamber, and moving the substrate carrier along a path within the processing chamber. In many examples, the movement of the substrate carrier and/or the velocity of the substrate carrier along the path may be controlled by adjusting the flow rate of the gas stream. The air cushion may be formed within at least one indentation pocket disposed within the lower surface. In some examples, the lower surface has at least two indentation pockets. The indentation pockets are configured to accept the gas cushion. An upper surface of the substrate carrier has at least one indentation area for supporting a substrate. The indentation pocket may have tapered side walls which taper away from the upper surface of the substrate carrier.

In another embodiment, a method for levitating substrates disposed on a substrate carrier during a vapor deposition process is provided which includes exposing a lower surface of a substrate carrier to a gas stream, wherein at least one wafer is disposed on an upper surface of the substrate carrier and the lower surface contains at least one indentation pocket, forming a gas cushion under the substrate carrier, levitating the substrate carrier within a processing chamber, and moving the substrate carrier along a path within the processing chamber.

In another embodiment, a method for levitating substrates disposed on a substrate carrier during a vapor deposition process is provided which includes exposing a lower surface of a substrate carrier to a gas stream, wherein the lower surface contains at least one indentation pocket, forming a gas cushion under the substrate carrier, levitating the substrate carrier within a processing chamber, and moving the substrate carrier along a path within the processing chamber.

In another embodiment, a method for levitating substrates disposed on a substrate carrier during a vapor deposition process is provided which includes exposing a lower surface of a substrate carrier to a gas stream, wherein the lower surface contains at least two indentation pockets, forming a gas cushion under the substrate carrier, levitating the substrate carrier within a processing chamber, and moving the substrate carrier along a path within the processing chamber.

Embodiments of the invention generally relate to a CVD reactor system and related methods of use. In one embodiment, a CVD system is provided which includes a lid assembly, such as a top plate, having a plurality of raised portions located along the longitudinal axis of the top plate. The system includes a track having a guide path, such as a channel, located along the longitudinal axis of the track, wherein the channel is adapted to receive the plurality of raised portions of the top plate, thereby forming a gap between the plurality of raised portions and a floor of the track, wherein the gap is configured to receive a substrate. The system includes a heating assembly, such as a heating element, operable to heat the substrate as the substrate moves along the channel of the track. In one embodiment, the track is operable to float the substrate along the channel of the track.

In one embodiment, system includes a trough that supports the track. The gap may have a thickness within a range from about 0.5 mm to about 5 mm, or from about 0.5 mm to about 1 mm. The top plate is formed from molybdenum or quartz, the track is formed from quartz or silica. The top plate is operable to direct a gas to the gap and may further include a plurality of ports located along the longitudinal axis of the top plate and disposed between the plurality of raised portions, thereby forming paths between the plurality of raised portions. One or more of the plurality of ports is adapted to communicate and/or exhaust a gas to the gap between plurality of raised portions of the top plate and the floor of the track.

Examples of the heating element include a heating lamp coupled to or with the track, a plurality of heating lamps disposed along the track, a heating lamp bank operable to move along the track as the substrate moves along the channel of the track, resistive heaters coupled to or with the track, an inductive heating source coupled to or with the substrate and/or the track. The heating element is operable to maintain a temperature differential across the substrate, wherein the temperature differential is less than 10° C. In one embodiment, the CVD system is an atmospheric pressure CVD system.

In one embodiment, a CVD system is provided which includes an entrance isolator operable to prevent contaminants from entering the system at an entrance of the system, an exit isolator operable to prevent contaminants from entering the system at an exit of the system, and an intermediate isolator disposed between the entrance and exit isolators. The system may further include a first deposition zone disposed adjacent the entrance isolator and a second deposition zone disposed adjacent the exit isolator. The intermediate isolator is disposed between the deposition zones and is operable to prevent mixing of gases between the first deposition zone and the second deposition zone.

In one embodiment, the entrance isolator is further operable to prevent back diffusion of gases injected into the first deposition zone, the intermediate isolator is further operable to prevent back diffusion of gases injected into the second deposition zone, and the exit isolator is further operable to prevent back diffusion of gases injected into the second deposition zone. An isolation zone formed by at least one of the isolators has a length within a range from about 1 meter to about 2 meters. A gas, such as nitrogen, is injected into the entrance isolator at a first flow rate, such as about 30 liters per minute, to prevent back diffusion of gases from the first deposition zone. A gas, such as arsine, is injected into the intermediate isolator at a first flow rate, such as about 3 liters per minute, to prevent back mixing of gases between the first deposition zone and the second deposition zone. A gas, such as nitrogen, is injected into the exit isolator at a first flow rate, such as about 30 liters per minute, to prevent contaminants from entering the system at the exit of the system. In one embodiment, an exhaust is disposed adjacent each isolator and operable to exhaust gases injected by the isolators. An exhaust may be disposed adjacent each deposition zone and operable to exhaust gases injected into the deposition zones.

In one embodiment, a CVD system is provided which includes a housing, a track surrounded by the housing, wherein the track forms a guide path, such as a channel, adapted to guide the substrate through the CVD system. The system includes a carrier for moving the substrate along the channel of the track, wherein the track is operable to levitate the carrier along the channel of the track. The housing contains or is formed from molybdenum, quartz, or stainless steel, the track contains or is formed from quartz, molybdenum, fused silica, ceramic, and the carrier is formed from graphite.

In one embodiment, the track contains a plurality of openings and/or a conduit disposed along the floor of the track each operable to supply a cushion of gas to the channel and the bottom surface of the carrier to lift or levitate the carrier and substantially center the carrier along the channel of the track. The conduit may have a v-shape and the carrier may have a notch (e.g., v-shape) disposed along its bottom surface. A gas is applied to the notch of the carrier to substantially lift the carrier from the floor of the track and to substantially center the carrier along the channel of the track. The track may be tilted, such as at an angle less than about 20°, less than about 10°, or between about 1° and about 5°, to allow the substrate to move and float from a first end of the channel to a second end of the channel. The track and/or housing may include multiple segments.

In one embodiment, the system may include a conveyor operable to automatically introduce substrates into the channel, a retriever operable to automatically retrieve substrates from the channel, and/or a heating element operable to heat the substrate. The heating element is coupled to or with the housing, the substrate, and/or the track. The carrier is operable to carry strips of the substrate along the channel of the track.

In one embodiment, a track assembly for moving a substrate through a CVD system is provided which includes a top section having a floor, side supports, such as a pair of rails, disposed adjacent the floor, thereby forming a guide path, such as a channel, to guide the substrate along the floor. A bottom section is coupled to or with the top section to form one or more chambers therebetween. The top section may include a recessed bottom surface and the bottom section may include a recessed top surface to form the chamber. In one embodiment the top section and/or the bottom section is formed from molybdenum, quartz, silica, alumina, or ceramic.

In one embodiment, the top section has a plurality of openings disposed through the floor to provide fluid communication between the chamber and the channel. A cushion of gas, such as nitrogen, is supplied from the chamber to the channel to substantially lift and carry the substrate from and along the floor of the top section. The floor may be tilted, such as at an angle less than about 10°, about 20°, or within range from about 1° to about 5°, to allow the substrate to move and float from a first end of the channel to a second end of the channel.

In one embodiment, the top section has a plurality of openings disposed through the pair of rails adjacent the floor. A gas is supplied through the plurality of openings to substantially center the substrate moving along the channel of the top section. The floor may also include a tapered profile and/or a conduit through which a gas is supplied each operable to substantially center the substrate moving along the channel of the top section. The conduit may have a v-shape and/or the substrate may have a notch (e.g., v-shaped) for receiving a gas cushion disposed along a bottom surface of the substrate operable to substantially center the substrate moving along the channel of the top section.

In one embodiment, the track assembly may include a conveyor operable to automatically introduce substrates into the channel and/or a retriever operable to automatically retrieve substrates from the channel. An injection line may be coupled to or with the bottom section to supply a gas to the chamber through the floor to substantially float the substrate along the floor of the top section. The top section may further include recessed portions adjacent the rails operable to receive reactor lid assembly, such as a top plate. The track assembly may include a trough in which the top section and bottom section are seated. The trough is formed from quartz, molybdenum, or stainless steel.

In one embodiment, a method for forming a multi-layered material during a CVD process is provided which includes forming a gallium arsenide buffer layer on a gallium arsenide substrate, forming an aluminum arsenide sacrificial layer on the buffer layer, and forming an aluminum gallium arsenide passivation layer on the sacrificial layer. The method may further include forming a gallium arsenide active layer (e.g., at about 1,000 nm thick) on the passivation layer. The method may further include forming a phosphorous gallium arsenide layer on the active layer. The method may further include removing the sacrificial layer to separate the active layer from the substrate. The aluminum arsenide sacrificial layer may be exposed to an etching solution while the gallium arsenide active layer is separated from the substrate during an epitaxial lift off process. The method may further include forming additional multi-layered materials on the substrate during a subsequent CVD process. The buffer layer may be about 300 nm in thickness, the passivation layer may be about 30 nm in thickness, and/or the sacrificial layer may be about 5 nm in thickness.

In one embodiment, a method of forming multiple epitaxial layers on a substrate using a CVD system is provided which includes introducing the substrate into a guide path, such as a channel, at an entrance of the system, while preventing contaminants from entering the system at the entrance, depositing a first epitaxial layer on the substrate, while the substrate moves along the channel of the system, depositing a second epitaxial layer on the substrate, while the substrate move along the channel of the system, preventing mixing of gases between the first deposition step and the second deposition step, and retrieving the substrate from the channel at an exit of the system, while preventing contaminants from entering the system at the exit. The method may further include heating the substrate prior to depositing the first epitaxial layer, maintaining the temperature of the substrate as the first and second epitaxial layers are deposited on the substrate, and/or cooling the substrate after depositing the second epitaxial layer. The substrate may substantially float along the channel of the system. The first epitaxial layer may include aluminum arsenide and/or the second epitaxial layer may include gallium arsenide. The method may further include depositing a phosphorous gallium arsenide layer on the substrate and/or heating the substrate to a temperature within a range from about 300° C. to about 800° C. during the depositing of the epitaxial layers. A center temperature to an edge temperature of the substrate may be within 10° C. of each other.

In one embodiment, a CVD reactor is provided which includes a lid assembly having a body, and a track assembly having a body and a guide path located along the longitudinal axis of the body. The body of the lid assembly and the body of the track assembly are coupled together to form a gap therebetween that is configured to receive a substrate. The reactor may further include a heating assembly containing a plurality of heating lamps disposed along the track assembly and operable to heat the substrate as the substrate moves along the guide path. The reactor may further include a track assembly support, wherein the track assembly is disposed in the track assembly support. The body of the track assembly may contain a gas cavity within and extending along the longitudinal axis of the body and a plurality of ports extending from the gas cavity to an upper surface of the guide path and configured to supply a gas cushion along the guide path. The body of the track assembly may contain quartz. The body of the lid assembly may include a plurality of ports configured to provide fluid communication to the guide path. The heating assembly may be operable to maintain a temperature differential across the substrate, wherein the temperature differential is less than 10° C. In one embodiment, the CVD reactor is an atmospheric pressure CVD reactor.

In one embodiment, a CVD system is provided which includes an entrance isolator operable to prevent contaminants from entering the system at an entrance of the system, an exit isolator operable to prevent contaminants from entering the system at an exit of the system, and an intermediate isolator disposed between the entrance and exit isolators. The system may further include a first deposition zone disposed adjacent the entrance isolator and a second deposition zone disposed adjacent the exit isolator. The intermediate isolator is disposed between the deposition zones and is operable to prevent mixing of gases between the first deposition zone and the second deposition zone. A gas is injected into the entrance isolator at a first flow rate to prevent back diffusion of gases from the first deposition zone, a gas is injected into the intermediate isolator at a first flow rate to prevent back mixing of gases between the first deposition zone and the second deposition zone, and/or a gas is injected into the exit isolator at a first flow rate to prevent contaminants from entering the system at the exit of the system. An exhaust may be disposed adjacent each isolator and operable to exhaust gases injected by the isolators and/or disposed adjacent each deposition zone and operable to exhaust gases injected into the deposition zones.

In one embodiment, a CVD system is provided which includes a housing, a track surrounded by the housing, wherein the track contains a guide path adapted to guide a substrate through the CVD system, and a substrate carrier for moving the substrate along the guide path, wherein the track is operable to levitate the substrate carrier along the guide path. The track may include a plurality of openings operable to supply a gas cushion to the guide path. The gas cushion is applied to a bottom surface of the substrate carrier to lift the substrate carrier from a floor of the track. The track may include a conduit disposed along the guide path and operable to substantially center the substrate carrier along the guide path of the track. A gas cushion may be supplied through the conduit to a bottom surface of the substrate carrier to substantially lift the substrate carrier from a floor of the track. The track may be tilted to allow the substrate to move from a first end of the guide path to a second end of the guide path. The system may include a heating assembly containing a plurality of heating lamps disposed along the track and operable to heat the substrate as the substrate moves along the guide path.

The CVD reactors, chambers, systems, zones, and derivatives of these reactors may be used for a variety of CVD and/or epitaxial deposition processes to form an assortment of materials on wafers or substrates, as described in embodiments herein. In one embodiment, a Group III/V material—which contains at least one element of Group III (e.g., boron, aluminum, gallium, or indium) and at least one element of Group V (e.g., nitrogen, phosphorous, arsenic, or antimony) may be formed or deposited on a wafer. Examples of deposited materials may contain gallium nitride, indium phosphide, indium gallium phosphide, gallium arsenide, aluminum gallium arsenide, aluminum arsenide derivatives thereof, alloys thereof, multi-layers thereof, or combinations thereof. In some embodiments herein, the deposited materials may be epitaxial materials. The deposited material or epitaxial material may contain one layer, but usually contains multiple layers. In some examples, the epitaxial material contains a layer having gallium arsenide and another layer having aluminum gallium arsenide. In another example, the epitaxial material contains a gallium arsenide buffer layer, an aluminum gallium arsenide passivation layer, and a gallium arsenide active layer. The gallium arsenide buffer layer may have a thickness within a range from about 100 nm to about 500 nm, such as about 300 nm, the aluminum arsenide sacrificial layer may have a thickness within a range from about 1 nm to about 20 nm, such as about 5 nm, the aluminum gallium arsenide passivation layer may have a thickness within a range from about 10 nm to about 50 nm, such as about 30 nm, and the gallium arsenide active layer may have a thickness within a range from about 500 nm to about 2,000 nm, such as about 1,000 nm. In some examples, the epitaxial material further contains a second aluminum gallium arsenide passivation layer.

In one embodiment, the process gas used in the CVD reactors, chambers, systems, zones may contain arsine, argon, helium, nitrogen, hydrogen, or mixtures thereof. In one example, the process gas contains an arsenic precursor, such as arsine. In other embodiments, the first precursor may contain an aluminum precursor, a gallium precursor, an indium precursor, or combinations thereof, and the second precursor may contain a nitrogen precursor, a phosphorus precursor, an arsenic precursor, an antimony precursor or combinations thereof.

Figure 20:
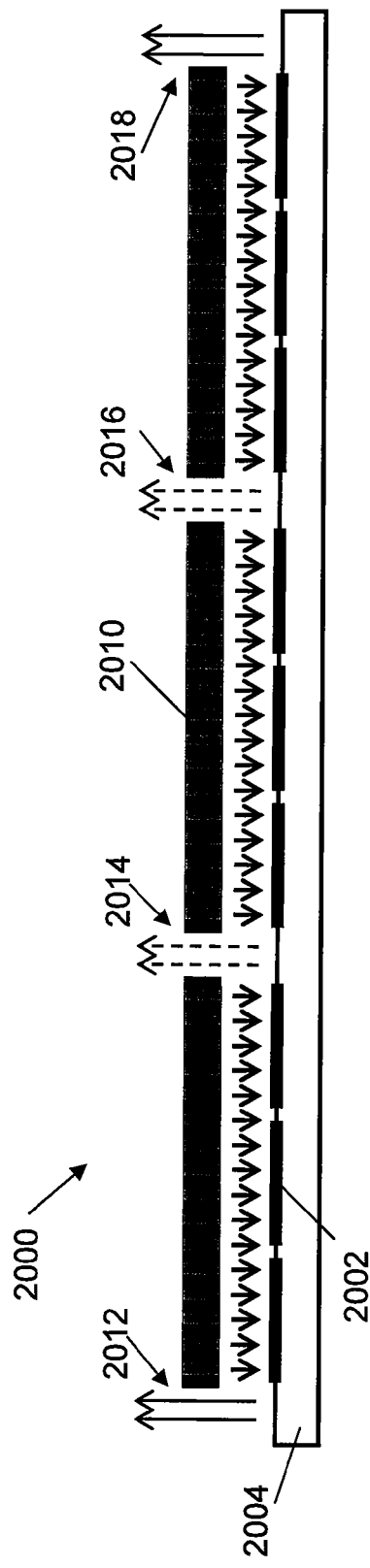
FIG. 20 depicts a CVD system having a plurality of tiled showerheads according to an alternative embodiment described herein.

In an alternative embodiment, a CVD system 2000 contains a plurality of showerheads 2010 disposed one after another in a linear path, as depicted in FIG. 20. The showerheads 2010 may be tiled together in order to produce the effect of a larger showerhead, such as to form large growth area or large deposition zone. Multiple wafers 2002 rest on a platter 2004 during the deposition processes. The wafers 2002 may also be placed in a tiled pattern in order to stay clear from any seams between the showerhead 2010. In one process embodiment, the CVD system 2000 may be exhausted between tiles of showerheads 2010, such as at exhaust ports 2014 and 2016, in order to reduce flow speed. The CVD system 2000 may also be exhausted at exhaust port 2012 and 2018.

Figure 21:
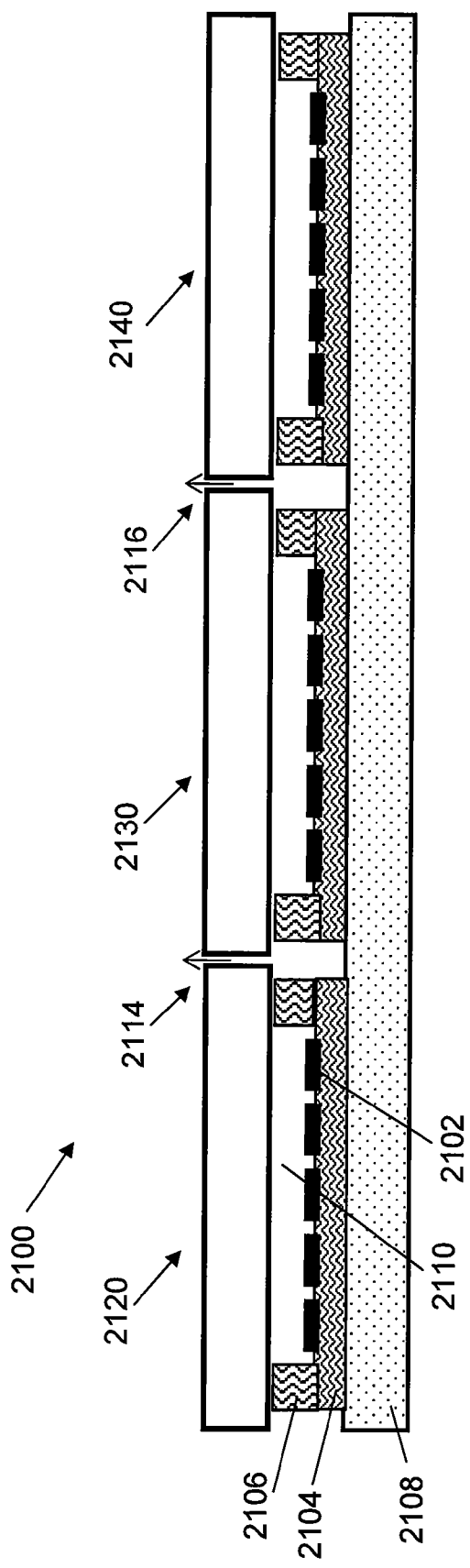
FIG. 21 depicts a CVD system having several processing zones according to another alternative embodiment described herein.

In another alternative embodiment, a CVD system 2100 contains a heat-up zone 2120, a growth zone 2130, and a cool-down zone 2140 along a linear path, as depicted in FIG. 21. Showerheads (not shown) are usually disposed within the growth zone 2130. Multiple wafers 2102 rest on each platter 2104 within each processing zone, such as the heat-up zone 2120, the growth zone 2130, and the cool-down zone 2140. Platter 2104 contains raised edges 2106 in order to form a "pocket"—such as process region 2110—around each group of wafers 2102. Process regions 2110 keep the wafers 2102 in a semi-enclosed environment within each of the processing zones. Platters 2104 are disposed on platform 2108, which contains a heater, a cooler, and a temperature regulation system (not shown). Therefore, the temperature for each of the heat-up zone 2120, the growth zone 2130, and the cool-down zone 2140 may be independently controlled and regulated by platform 2108.

The CVD system 2100 provides for a much narrower gap for isolation than growth zone and reduces the total flow rate requirement for back-flow isolation. In one process embodiment, the heat-up zone 2120 and the growth zone 2130 may be separated by isolation exhaust port 2114 therebetween, similarly, the growth zone 2130 and the cool-down zone 2140 may be separated by isolation exhaust port 2116.

While the foregoing is directed to embodiments of the invention, other and further embodiments of the invention may be devised without departing from the basic scope thereof, and the scope thereof is determined by the claims that follow.

The invention claimed is:

1. A method for forming a multi-layered material, comprising:
   advancing a plurality of wafers through a deposition system, wherein the deposition system comprises a first deposition zone, a second deposition zone, a third deposition zone, and a fourth deposition zone;
   depositing a buffer layer on a first wafer within the first deposition zone;
   depositing a sacrificial layer on the first wafer within the second deposition zone, while depositing the buffer layer on a second wafer within the first deposition zone;
   depositing a passivation layer on the first wafer within the third deposition zone, while depositing the sacrificial layer on the second wafer within the second deposition zone, and while depositing the buffer layer on a third wafer within the first deposition zone; and
   depositing a gallium arsenide active layer on the first wafer within the fourth deposition zone by an epitaxial process, while depositing the passivation layer on the second wafer within the third deposition zone, while depositing the sacrificial layer on the third wafer within the second deposition zone, and while depositing the buffer layer on a fourth wafer within the first deposition zone.

2. A method for forming a multi-layered material during a continuous chemical vapor deposition process, comprising:
   continuously advancing a plurality of wafers through a deposition system, wherein the deposition system comprises a first deposition zone, a second deposition zone, a third deposition zone, and a fourth deposition zone;
   depositing a buffer layer on a first wafer within the first deposition zone;
   depositing a sacrificial layer on the first wafer within the second deposition zone, while depositing the buffer layer on a second wafer within the first deposition zone;
   depositing a passivation layer on the first wafer within the third deposition zone, while depositing the sacrificial layer on the second wafer within the second deposition zone, and while depositing the buffer layer on a third wafer within the first deposition zone; and
   depositing a gallium arsenide active layer on the first wafer within the fourth deposition zone, while depositing the passivation layer on the second wafer within the third deposition zone, while depositing the sacrificial layer on the third wafer within the second deposition zone, and while depositing the buffer layer on a fourth wafer within the first deposition zone, further comprising heating each of the wafers to a predetermined temperature within a heat-up zone prior to advancing into the first deposition zone.

3. The method of claim 2, wherein the predetermined temperature is within a range from about 50° C. to about 750° C.

4. The method of claim 3, wherein the predetermined temperature is within a range from about 100° C. to about 350° C.

5. A method for forming a multi-layered material during a continuous chemical vapor deposition process, comprising:
   continuously advancing a plurality of wafers through a deposition system, wherein the deposition system comprises a first deposition zone, a second deposition zone, a third deposition zone, and a fourth deposition zone;
   depositing a buffer layer on a first wafer within the first deposition zone;
   depositing a sacrificial layer on the first wafer within the second deposition zone, while depositing the buffer layer on a second wafer within the first deposition zone;
   depositing a passivation layer on the first wafer within the third deposition zone, while depositing the sacrificial layer on the second wafer within the second deposition zone, and while depositing the buffer layer on a third wafer within the first deposition zone; and
   depositing a gallium arsenide active layer on the first wafer within the fourth deposition zone, while depositing the passivation layer on the second wafer within the third deposition zone, while depositing the sacrificial layer on the third wafer within the second deposition zone, and while depositing the buffer layer on a fourth wafer within the first deposition zone, further comprising transferring each of the wafers into a cool-down zone subsequent to depositing the gallium arsenide active layer.

6. The method of claim 5, further comprising cooling each of the wafers to a predetermined temperature within a range from about 18° C. to about 30° C. while in the cool-down zone.

7. A method for forming a multi-layered material during a continuous chemical vapor deposition process, comprising:
   continuously advancing a plurality of wafers through a deposition system, wherein the deposition system comprises a first deposition zone, a second deposition zone, a third deposition zone, and a fourth deposition zone;
   depositing a buffer layer on a first wafer within the first deposition zone;
   depositing a sacrificial layer on the first wafer within the second deposition zone, while depositing the buffer layer on a second wafer within the first deposition zone;
   depositing a passivation layer on the first wafer within the third deposition zone, while depositing the sacrificial layer on the second wafer within the second deposition zone, and while depositing the buffer layer on a third wafer within the first deposition zone; and
   depositing a gallium arsenide active layer on the first wafer within the fourth deposition zone, while depositing the passivation layer on the second wafer within the third deposition zone, while depositing the sacrificial layer on the third wafer within the second deposition zone, and while depositing the buffer layer on a fourth wafer within the first deposition zone, wherein the wafers pass through a heat-up zone prior to entering the first deposition zone and the wafers pass through a cool-down zone subsequent to exiting the fourth deposition zone.

8. The method of claim 7, wherein the heat-up zone, the first, second, third, and fourth deposition zones, and the cool-down zone share a common linear path, and the wafers continuously and horizontally advance along the common linear path within the deposition system.

9. The method of claim 1, further comprising flowing at least one gas between each of the deposition zones to form gas curtains therebetween.

10. A method for forming a multi-layered material during a continuous chemical vapor deposition process, comprising:
   continuously advancing a plurality of wafers through a deposition system, wherein the deposition system comprises a first deposition zone, a second deposition zone, a third deposition zone, and a fourth deposition zone;
   depositing a buffer layer on a first wafer within the first deposition zone;
   depositing a sacrificial layer on the first wafer within the second deposition zone, while depositing the buffer layer on a second wafer within the first deposition zone;

depositing a passivation layer on the first wafer within the third deposition zone, while depositing the sacrificial layer on the second wafer within the second deposition zone, and while depositing the buffer layer on a third wafer within the first deposition zone; and depositing a gallium arsenide active layer on the first wafer within the fourth deposition zone, while depositing the passivation layer on the second wafer within the third deposition zone, while depositing the sacrificial layer on the third wafer within the second deposition zone, and while depositing the buffer layer on a fourth wafer within the first deposition zone, further comprising flowing at least one gas between each of the deposition zones to form gas curtains therebetween, wherein the at least one gas comprises hydrogen, arsine, a mixture of hydrogen and arsine, nitrogen, argon, or combinations thereof.

11. The method of claim 10, wherein the at least one gas comprises a mixture of hydrogen and arsine.

12. The method of claim 1, further comprising depositing a gallium-containing layer on the first wafer within a fifth deposition zone, while depositing the gallium arsenide active layer on the second wafer within the fourth deposition zone, while depositing the passivation layer on the third wafer within the third deposition zone, while depositing the sacrificial layer on the fourth wafer within the second deposition zone, and while depositing the buffer layer on a fifth wafer within the first deposition zone.

13. The method of claim 12, wherein the gallium-containing layer comprises a phosphorous gallium arsenide.

14. The method of claim 1, wherein the wafers are gallium arsenide wafers.

15. A method for forming a multi-layered material, comprising:
    advancing a plurality of wafers through a deposition system, wherein the deposition system comprises a heat-up zone, a first deposition zone, a second deposition zone, a third deposition zone, a fourth deposition zone, and a cool-down zone;
    depositing a gallium arsenide buffer layer on a first wafer within the first deposition zone;
    depositing an aluminum arsenide sacrificial layer on the first wafer within the second deposition zone, while depositing the gallium arsenide buffer layer on a second wafer within the first deposition zone;
    depositing an aluminum gallium arsenide passivation layer on the first wafer within the third deposition zone, while depositing the aluminum arsenide sacrificial layer on the second wafer within the second deposition zone, and while depositing the gallium arsenide buffer layer on a third wafer within the first deposition zone; and
    depositing a gallium arsenide active layer on the first wafer within the fourth deposition zone using an epitaxial deposition process, while depositing the aluminum gallium arsenide passivation layer on the second wafer within the third deposition zone, while depositing the aluminum arsenide sacrificial layer on the third wafer within the second deposition zone, and while depositing the gallium arsenide buffer layer on a fourth wafer within the first deposition zone; and
    flowing at least one gas between each of the deposition zones to form gas curtains therebetween.

16. A method for forming a multi-layered material, comprising:
    advancing a plurality of wafers through a deposition system, wherein the deposition system comprises a first deposition zone, a second deposition zone, a third deposition zone, and a fourth deposition zone;
    depositing a first material layer on a first wafer within the first deposition zone;
    depositing a second material layer on the first wafer within the second deposition zone, while depositing the first material layer on a second wafer within the first deposition zone;
    depositing a third material layer on the first wafer within the third deposition zone, while depositing the second material layer on the second wafer within the second deposition zone, and while depositing the first material layer on a third wafer within the first deposition zone; and
    depositing a fourth material layer on the first wafer within the fourth deposition zone, while depositing the third material layer on the second wafer within the third deposition zone, while depositing the second material layer on the third wafer within the second deposition zone, and while depositing the first material layer on a fourth wafer within the first deposition zone;
    heating each of the wafers to a predetermined temperature within a heat-up zone prior to advancing into the first deposition zone; and
    flowing at least one gas between each of the deposition zones to form gas curtains therebetween.

17. The method of claim 16, wherein the first material layer, the second material layer, the third material layer, and the fourth material layer have the same composition.

18. The method of claim 16, wherein each of the first material layer, the second material layer, the third material layer, and the fourth material layer has a different composition.

19. The method of claim 16, wherein each of the first material layer, the second material layer, the third material layer, and the fourth material layer comprises arsenic.

20. The method of claim 16, further comprising depositing a fifth material layer on the first wafer within a fifth deposition zone, while depositing the fourth material layer on the second wafer within the fourth deposition zone, while depositing the third material layer on the third wafer within the third deposition zone, while depositing the second material layer on the fourth wafer within the second deposition zone, and while depositing the first material layer on a fifth wafer within the first deposition zone.

21. A method for forming a multi-layered material during a continuous chemical vapor deposition process, comprising:
    continuously advancing a plurality of wafers through a deposition system, wherein the deposition system comprises a first deposition zone, a second deposition zone, a third deposition zone, and a fourth deposition zone;
    depositing a first material layer on a first wafer within the first deposition zone;
    depositing a second material layer on the first wafer within the second deposition zone, while depositing the first material layer on a second wafer within the first deposition zone;
    depositing a third material layer on the first wafer within the third deposition zone, while depositing the second material layer on the second wafer within the second deposition zone, and while depositing the first material layer on a third wafer within the first deposition zone; and
    depositing a fourth material layer on the first wafer within the fourth deposition zone, while depositing the third material layer on the second wafer within the third deposition zone, while depositing the second material layer on the third wafer within the second deposition zone, and while depositing the first material layer on a fourth wafer within the first deposition zone, further comprising heating each of the wafers to a predetermined temperature within a heat-up zone prior to advancing into the first deposition zone.

22. The method of claim 21, wherein the predetermined temperature is within a range from about 50° C. to about 750° C.

23. The method of claim 22, wherein the predetermined temperature is within a range from about 100° C. to about 350° C.

24. The method of claim 22, wherein each of the wafers is heated to the predetermined temperature for a duration within a range from about 2 minutes to about 6 minutes.

25. The method of claim 24, wherein the duration is within a range from about 3 minutes to about 5 minutes.

26. A method for forming a multi-layered material during a continuous chemical vapor deposition process, comprising:
   continuously advancing a plurality of wafers through a deposition system, wherein the deposition system comprises a first deposition zone, a second deposition zone, a third deposition zone, and a fourth deposition zone;
   depositing a first material layer on a first wafer within the first deposition zone;
   depositing a second material layer on the first wafer within the second deposition zone, while depositing the first material layer on a second wafer within the first deposition zone;
   depositing a third material layer on the first wafer within the third deposition zone, while depositing the second material layer on the second wafer within the second deposition zone, and while depositing the first material layer on a third wafer within the first deposition zone; and
   depositing a fourth material layer on the first wafer within the fourth deposition zone, while depositing the third material layer on the second wafer within the third deposition zone, while depositing the second material layer on the third wafer within the second deposition zone, and while depositing the first material layer on a fourth wafer within the first deposition zone, further comprising transferring each of the wafers into a cool-down zone subsequent to depositing the fourth material layer.

27. The method of claim 26, further comprising cooling each of the wafers to a predetermined temperature while in the cool-down zone.

28. The method of claim 27, wherein the predetermined temperature is within a range from about 18° C. to about 30° C.

29. The method of claim 27, wherein each of the wafers is cooled to the predetermined temperature for a duration within a range from about 2 minutes to about 6 minutes.

30. The method of claim 29, wherein the duration is within a range from about 3 minutes to about 5 minutes.

31. A method for forming a multi-layered material during a continuous chemical vapor deposition process, comprising:
   continuously advancing a plurality of wafers through a deposition system, wherein the deposition system comprises a first deposition zone, a second deposition zone, a third deposition zone, and a fourth deposition zone;
   depositing a first material layer on a first wafer within the first deposition zone;
   depositing a second material layer on the first wafer within the second deposition zone, while depositing the first material layer on a second wafer within the first deposition zone;
   depositing a third material layer on the first wafer within the third deposition zone, while depositing the second material layer on the second wafer within the second deposition zone, and while depositing the first material layer on a third wafer within the first deposition zone; and
   depositing a fourth material layer on the first wafer within the fourth deposition zone, while depositing the third material layer on the second wafer within the third deposition zone, while depositing the second material layer on the third wafer within the second deposition zone, and while depositing the first material layer on a fourth wafer within the first deposition zone, wherein the wafers pass through a heat-up zone prior to entering the first deposition zone and the wafers pass through a cool-down zone subsequent to exiting the fourth deposition zone.

32. The method of claim 31, wherein the heat-up zone, the first, second, third, and fourth deposition zones, and the cool-down zone share a common linear path which the wafers continuously and horizontally traverse along in one direction within the deposition system.

* * * * *